United States Patent
Sago et al.

(10) Patent No.: US 9,490,456 B2
(45) Date of Patent: Nov. 8, 2016

(54) METHOD OF MANUFACTURING ORGANIC EL ELEMENT, ORGANIC EL ELEMENT, ORGANIC EL APPARATUS, AND ELECTRONIC DEVICE

(71) Applicant: SEIKO EPSON CORPORATION, Tokyo (JP)

(72) Inventors: Takumi Sago, Matsumoto (JP); Seiichi Tanabe, Shiojiri (JP); Shotaro Watanabe, Chino (JP); Kohei Ishida, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 59 days.

(21) Appl. No.: 14/474,892

(22) Filed: Sep. 2, 2014

(65) Prior Publication Data
US 2015/0060828 A1 Mar. 5, 2015

(30) Foreign Application Priority Data
Sep. 3, 2013 (JP) .................. 2013-181892

(51) Int. Cl.
| | |
|---|---|
| H01J 1/62 | (2006.01) |
| H01L 51/56 | (2006.01) |
| H01L 51/50 | (2006.01) |
| H01L 51/00 | (2006.01) |
| H01L 27/32 | (2006.01) |

(52) U.S. Cl.
CPC .......... *H01L 51/56* (2013.01); *H01L 27/3211* (2013.01); *H01L 51/0005* (2013.01); *H01L 51/0008* (2013.01); *H01L 51/506* (2013.01); *H01L 51/5012* (2013.01); *H01L 51/5072* (2013.01); *H01L 51/5092* (2013.01); *H01L 27/3244* (2013.01); *H01L 51/004* (2013.01); *H01L 51/0037* (2013.01); *H01L 51/0059* (2013.01); *H01L 51/0081* (2013.01)

(58) Field of Classification Search
USPC .................................................. 313/504, 498
See application file for complete search history.

(56) References Cited

U.S. PATENT DOCUMENTS

| | | | |
|---|---|---|---|
| 2008/0124570 A1 | 5/2008 | Kondo et al. | |
| 2009/0243475 A1* | 10/2009 | Shoda ................... | C23C 14/083 313/504 |

(Continued)

FOREIGN PATENT DOCUMENTS

| | | |
|---|---|---|
| JP | A-2004-296226 | 10/2004 |
| JP | A-2006-190759 | 7/2006 |

(Continued)

*Primary Examiner* — Vip Patel
(74) *Attorney, Agent, or Firm* — Oliff PLC

(57) ABSTRACT

An organic EL element with a functional layer including at least a hole injection layer, a hole transport layer, and a luminescence layer laminated from a pixel electrode side in order between a pixel electrode as an anode and a counter electrode as a cathode, and a method of manufacturing the organic EL element has a forming process by applying a solution including a low molecular material and a high molecular material to at least one layer among the hole injection layer, the hole transport layer, and luminescence layer, in which the molecular weight of low molecular material is 10,000 or less and the molecular weight of high molecular material is 10,000 to 300,000, and in which a mixing ratio of low molecular material is 10 wt % to 90 wt % with respect to the weight of low molecular material and high molecular material included in the solution.

20 Claims, 11 Drawing Sheets

(56) References Cited

U.S. PATENT DOCUMENTS

2009/0309094 A1 12/2009 Frey et al.
2011/0248247 A1 10/2011 Matsumoto et al.

FOREIGN PATENT DOCUMENTS

| JP | A-2009-528400 | 8/2009 |
| JP | A-2011-233855 | 11/2011 |

* cited by examiner

FIG. 9

| | MATERIAL CONSTITUTION | | |
|---|---|---|---|
| | α-NPD [wt%] | PVK [wt%] | WEIGHT AVERAGE MOLECULAR WEIGHT OF PVK |
| COMPARATIVE EXAMPLE 1 | 100 | 0 | — |
| COMPARATIVE EXAMPLE 2 | 0 | 100 | 100,000 |
| COMPARATIVE EXAMPLE 3 | 60 | 40 | 500,000 |
| EXAMPLE 1 | 10 | 90 | 10,000 |
| EXAMPLE 2 | 30 | 70 | 10,000 |
| EXAMPLE 3 | 60 | 40 | 10,000 |
| EXAMPLE 4 | 90 | 10 | 10,000 |
| EXAMPLE 5 | 10 | 90 | 100,000 |
| EXAMPLE 6 | 30 | 70 | 100,000 |
| EXAMPLE 7 | 60 | 40 | 100,000 |
| EXAMPLE 8 | 90 | 10 | 100,000 |
| EXAMPLE 9 | 60 | 40 | 300,000 |
| EXAMPLE 10 | 90 | 10 | 300,000 |

FIG. 10

| | FILM DEFECT | LUMINESCENT EFFICIENCY [Cd/A] | ELEMENT LIFETIME [LT50] |
|---|---|---|---|
| COMPARATIVE EXAMPLE 1 | PRESENCE | 1.00 | 1.00 |
| COMPARATIVE EXAMPLE 2 | ABSENCE | 0.50 | 0.20 |
| COMPARATIVE EXAMPLE 3 | PRESENCE | — | — |
| EXAMPLE 1 | ABSENCE | 0.60 | 0.45 |
| EXAMPLE 2 | ABSENCE | 0.70 | 0.65 |
| EXAMPLE 3 | ABSENCE | 0.90 | 0.80 |
| EXAMPLE 4 | ABSENCE | 0.95 | 0.90 |
| EXAMPLE 5 | ABSENCE | 0.60 | 0.45 |
| EXAMPLE 6 | ABSENCE | 0.70 | 0.65 |
| EXAMPLE 7 | ABSENCE | 0.90 | 0.80 |
| EXAMPLE 8 | ABSENCE | 0.95 | 0.90 |
| EXAMPLE 9 | ABSENCE | 0.90 | 0.80 |
| EXAMPLE 10 | ABSENCE | 0.95 | 0.90 |

FIG. 12

| | LOW MOLECULAR MATERIAL | HIGH MOLECULAR MATERIAL |
|---|---|---|
| HOLE INJECTION LAYER / HOLE TRANSPORT LAYER | • m-MTDATA (4,4',4''-Tris(N-3-methylphenyl-N-phenyl-amino)triphenylamine)<br>• 2T-NATA (4,4',4''-Tris(N-(naphthalen-2-yl)-N-phenyl-amino)triphenylamine)<br>• 1T-NATA (4,4',4''-Tris(N-(naphthalen-1-yl)-N-phenyl-amino)triphenylamine)<br>• NATA(4,4',4''-Tris(N,N-diphenyl-amino)triphenylamine)<br>• NPNPB (N,N-di-phenyl-N,N'-di-[4-(N, N-di-phenyl-amino)phenyl]benzidine)<br>• TPD (N, N'-Bis(3-methylphenyl)-N,N'-bis(phenyl)-benzidine)<br>• N, N'-Bis(naphthalen-1-yl)-N,N'-bis(phenyl)-benzidine | • Poly(3-hexylthiophene-2,5-diyl)<br>• Poly(thiophene-2,5-diyl)<br>• Poly(N-vinylcarbazole)<br>• Poly[N,N'-bis(4-butylphenyl)-N,N'-bis(phenyl)-benzidine] |
| BLUE LUMINESCENCE LAYER | • N, N-Bis(naphthalen-1-yl)-N,N'-bis(phenyl)-benzidine<br>• 4,4'-Bis(2,2-diphenyl-ethen-1-yl)biphenyl<br>• 2-Tert-butyl-9,10-di(naphth-2-yl)anthracene<br>• 4,4'-Bis[2,2-di(4-methylphenyl)-ethen-1-yl]biphenyl<br>• 4,4'-Bis[4-(di-p-tolylamino)styryl]biphenyl<br>• Bis(3,5-difluoro-2-(2-pyridyl)phenyl-(2-carboxypyridyl)iridium III | • Poly(methylmethacrylate)<br>• Poly(9,9-dioctylfluorenyl-2,7-diyl)<br>• Poly[(9,9-dioctylfluorenyl-2,7-diyl)-co-(9-hexyl-3,6-carbazole)] |
| GREEN LUMINESCENCE LAYER | • 4,4'-Bis(carbazol-9-yl)biphenyl<br>• 3-(2-Benzothiazolyl)-7-(diethylamino)coumarin<br>• N,N'-Dimethyl-quinacridone<br>• Tris(2-phenylpyridine)iridium(III)<br>• 4,4'-Bis(carbazol-9-yl)biphenyl<br>• 4,4'-Bis(carbazol-9-yl)-2,2'-dimethylbiphenyl<br>• Tris(8-hydroxy-quinolinato)aluminium | • Poly[(9,9-dioctylfluorenylene-2,7-diyl)-co-(1,4-phenylenevinylene)]<br>• Poly[(9,9-dioctyl-2,7-divinylenefluorenylene)-alt-co-(2-methoxy-5-(2-ethylhexyloxy)-1,4-phenylene)]<br>• Poly[(9,9-dioctyl-2,7-bis(2-cyanovinylenefluorenylene)-alt-co-(2-methoxy-5-(2-ethylhexyloxy)-1,4-phenylene)] |
| RED LUMINESCENCE LAYER | • (E)-2-(2-(4-(dimethylamino)styryl)-6-methyl-4H-pyran-4-ylidene)-Malononitrile<br>• 4-(Dicyanomethylene)-2-methyl-6-julolidyl-9-enyl-4H-pyran<br>• 4-(Dicyanomethylene)-2-tert-butyl-6-(1,1,7,7-tetramethyljulolidin-4-yl-vinyl)-4H-pyran<br>• Bis(2-benzo[b]thiophen-2-yl-pyridine)(acetylacetonate)iridium(III)<br>• 4,4'-Bis(carbazol-9-yl)biphenyl<br>• 4,4'-Bis(carbazol-9-yl)-2,2'-dimethylbiphenyl<br>• Tris(8-hydroxy-quinolinato)aluminium | • Poly[9,9-dihexyl-2,7-bis(1-cyanovinylene)fluorenylene}-alt-co-{2,5-bis(N,N-diphenylamino)-1,4-phenylene}]<br>• Poly[{2-methoxy-5-(2-ethylhexyloxy)-1,4-(1-cyanovinylenephenylene)}-co-{2,5-bis(N,N'-diphenylamino)-1,4-phenylene}]<br>• Poly[1-methoxy-4-(2-ethylhexyloxy-2,5-phenylenevinylene)] |

METHOD OF MANUFACTURING ORGANIC EL ELEMENT, ORGANIC EL ELEMENT, ORGANIC EL APPARATUS, AND ELECTRONIC DEVICE

BACKGROUND

1. Technical Field

The present invention relates to a method of manufacturing an organic EL element, an organic EL element, an organic EL apparatus provided with the organic EL element, and an electronic device.

2. Related Art

An organic electro-luminescence (EL) element has a functional layer including a luminescence material consisting of an organic compound between an anode and a cathode. As a method of forming such a functional layer, a vapor phase process such as a vacuum deposition method (also referred to as a dry process) and a liquid phase process using a solution in which a functional layer forming material is dissolved or dispersed in a solvent (also referred to as a wet process or a coating process) are known. Generally, a low molecular material is suitably used in the vapor phase process and a high molecular material is used in the liquid phase process from the viewpoint of film forming properties. It is known that the high molecular material is inferior in terms of the luminescent efficiency and the luminescent lifetime in some cases, compared to the low molecular material. On the other hand, since the organic EL element can relatively easily be formed on a large substrate, compared to the vapor phase process, the liquid phase process has been continuously developed.

For example, in JP-A-2006-190759, an organic EL element in which a hole injection and transport layer is a high molecular hole injection and transport layer obtained by forming a film using a high molecular material by a wet process and a luminescence layer is a low molecular luminescence layer obtained by forming a film using a low molecular luminescence material by a wet process is disclosed. As the low molecular luminescence material, an asymmetric low molecular compound having an anthracene skeleton or a pyrene skeleton is included.

In addition, for example, in JP-A-2011-233855, a method of manufacturing an organic EL display apparatus having a first organic EL element of blue color and a second organic EL element of other colors and a method of forming a second organic luminescence layer of the second organic EL element by an coating process using a mixed material including a low molecular material and a high molecular material are disclosed. According to JP-A-2011-233855, as a low molecular material, for example, a monomer having a weight average molecular weight of 50,000 or less is included.

In JP-A-2006-190759 describe above, as a method of forming the luminescence layer, an example of forming a film using a toluene solution including 1 wt % of the low molecular luminescence material by a spin coat method to form the luminescence layer in which the luminescence of blue color can be obtained is described. However, in a case where the organic EL element is applied to pixels of a flat display panel, it is necessary to produce the organic EL element in which the luminescence of not only blue color but also red color, green color, and the like can be obtained on a substrate. That is, the need for separately applying a solution, selectively, including the low molecular luminescence material corresponding to the pixels of each color arises. In doing so, there is a problem in which an aggregation of the low molecular material occurs in a region which is separately applied, selectively, and thus a coating unevenness easily occurs, compared to a case of forming a film by applying a solution onto an entire surface of the substrate such as a spin coat method.

On the other hand, in JP-A-2011-233855, as a method of selectively applying a solution or a dispersion liquid including a mixed material mixing the low molecular material and the high molecular material, a liquid droplet discharging method such as an ink jet method or a nozzle coat method is included. In addition, in JP-A-2011-233855, though the weight average molecular weight of the low molecular material is set to 50,000 or less, there is a request for using the low molecular material having even smaller weight average molecular weight in order to further improve the luminescent efficiency and the luminescent lifetime of the organic EL element. That is, a method of manufacturing the organic EL element in which both film forming properties in separately applying a solution, selectively, and characteristics required after forming a film can be achieved is required.

SUMMARY

The invention can be realized in the following forms or application examples.

Application Example

According to this application example, there is provided a method of manufacturing an organic EL element having a functional layer including at least a hole injection layer, a hole transport layer, and a luminescence layer laminated between an anode and a cathode from the anode side in order, including a forming process at least one layer of the hole injection layer, the hole transport layer, and the luminescence layer by applying a solution including a low molecular material and a high molecular material, in which the molecular weight of the low molecular material is 10,000 or less and the weight average molecular weight of the high molecular material is from 10,000 to 300,000, and in which a mixing ratio of the low molecular material is from 10 wt % to 90 wt % with respect to the weight of the low molecular material and the high molecular material included in the solution.

According to this application example, even if the solution is selectively applied, the viscosity of the solution increases in a dry process of the solution which is applied and moving of the low molecular material is suppressed, and thus a film formation failure is reduced due to an aggregation of the low molecular material. That is, a method of manufacturing an organic EL element which can manufacture an organic EL element reducing the film formation failure and having excellent luminescent efficiency and luminescent lifetime can be provided.

In the method of manufacturing an organic EL element according to this application example, it is preferable that the high molecular material be selected from a polymethylmethacrylate resin, a silicone resin, an urethane resin, a norbornene resin, a fluororesin, a low-density polyethylene resin, a polyester resin, polyparaphenylene vinylene, polyfluorene, polyaniline, polythiophene, or polyvinylcarbazole and a derivative thereof.

According to this method, it is possible to produce the solution suitable for a liquid droplet discharging method such as an ink jet method or a nozzle coat method by using the high molecular material and both discharging properties and film forming properties of the solution in the liquid droplet discharging method can be achieved.

In the method of manufacturing an organic EL element according to the application example, when the size of a band gap of the low molecular material is set to Eg1 and the size of a band gap of the high molecular material is set to Eg2, it is preferable that the high molecular material in which the relation Eg1≤Eg2 is satisfied be selected.

In the luminescence layer of an organic EL element, excitons are formed by holes injected from the anode and electrons injected from the cathode, and when the excitons are disappeared (when the electrons and the holes are recombined), a part of the energy is released as fluorescence and phosphorescence.

That is, the size of the band gap of the low molecular material and the high molecular material (the difference between a HOMO level and a LUMO level in the electrons) included in the solution relates to the energy bringing about luminescence. When the high molecular material having smaller band gap Eg2 than the band gap Eg1 of the low molecular material is used, a part of the energy bringing about luminescence is absorbed in the high molecular material having a small band gap or an exciplex is formed. As a result, the energy bringing about luminescence substantively becomes smaller and the luminescence wavelength becomes a longer wavelength than a target wavelength, and thus there is a risk in which the luminescent efficiency is reduced or a target chromaticity can not be obtained.

According to this application example, since the high molecular material in which the relation Eg1≤Eg2 is satisfied is selected, the organic EL element in which an excellent luminescent efficiency and a target chromaticity can be obtained can be manufactured.

In the method of manufacturing an organic EL element according to the application example, it is preferable that, in the functional layer, the high molecular material included in the solution which is used to form an upper layer laminated on a lower layer be the same type as the high molecular material included in the lower layer.

According to this method, since the adhesion properties between the lower layer and the upper layer are ensured, it is possible to reduce the film formation failure due to the insufficiency of adhesion properties.

In the method of manufacturing an organic EL element according to the application example, it is preferable that the solution include a good solvent for dissolving the high molecular material and the boiling point of the good solvent be 200° C. or higher.

According to this method, it is possible to produce the solution suitable for the liquid droplet discharging method and obtain stable discharge properties, by using the good solvent having a boiling point of 200° C. or higher. That is, it is possible to stably apply the solution to a required region with a required amount.

Application Example

According to the application example, there is provided an organic EL element including an anode, a cathode, and a functional layer including at least a hole injection layer, a hole transport layer, and a luminescence layer laminated between the anode and the cathode from the anode side in order, in which at least one layer among the hole injection layer, the hole transport layer, and the luminescence layer includes a low molecular material and a high molecular material, in which the molecular weight of the low molecular material is 10,000 or less and the weight average molecular weight of the high molecular material is from 10,000 to 300,000, and in which a mixing ratio of the low molecular material is from 10 wt % to 90 wt % with respect to the weight of the low molecular material and the high molecular material.

According to this application example, since at least one layer among the hole injection layer, the hole transport layer, and the luminescence layer includes the low molecular material and the high molecular material, the luminescent efficiency close to that of the case of using the low molecular material alone and the stability of the film formation close to that of the case of using the high molecular material alone are realized and an organic EL element having excellent luminescent efficiency and luminescent lifetime can be provided.

In the organic EL element according to the application example, it is preferable that the high molecular material be selected from a polymethylmethacrylate resin, a silicone resin, an urethane resin, a norbornene resin, a fluororesin, a low-density polyethylene resin, a polyester resin, polyparaphenylene vinylene, polyfluorene, polyaniline, polythiophene, or polyvinylcarbazole and a derivative thereof.

According to this configuration, an organic EL element in which stable film forming properties can be achieved can be provided.

In the organic EL element according to the application example, when the size of a band gap of the low molecular material is set to Eg1 and the size of a band gap of the high molecular material is set to Eg2, it is preferable that the high molecular material in which the relation Eg1≤Eg2 is satisfied be selected.

According to this configuration, the high molecular material in which the relation Eg1≤Eg2 is satisfied is selected, and thus a part of the energy bringing about luminescence is hardly absorbed in the high molecular material or the exciplex is hardly formed between the low molecular material and the high molecular material. Therefore, since the energy bringing about luminescence is not uselessly consumed, the organic EL element in which an excellent luminescent efficiency and a target chromaticity are obtained can be provided.

In the organic EL element according to the application example, it is preferable that, in the functional layer, the high molecular material included in an upper layer laminated on a lower layer be the same type as the high molecular material included in the lower layer.

According to this configuration, the adhesion properties between the lower layer and the upper layer in the functional layer are improved and stable film forming properties can be ensured. Therefore, the organic EL element having excellent luminescent efficiency and luminescent lifetime can be provided.

Application Example

According to this application example, there is provided an organic EL apparatus provided with an organic EL element manufactured by using the method of manufacturing an organic EL element described in the application example or the organic EL element described in the application example.

According to this application example, the organic EL apparatus provided with both excellent luminescent efficiency and luminescent lifetime can be provided.

Application Example

According to this application example, there is provided an electronic device provided with the organic EL apparatus described in the application example.

According to the application example, the electronic device provided with both excellent luminescent efficiency and luminescent lifetime can be provided.

BRIEF DESCRIPTION OF THE DRAWINGS

The invention will be described with reference to the accompanying drawings, wherein like numbers reference like elements.

FIG. 9 is a table showing a material constitution of a hole transport layer in Examples and Comparative Examples.

FIG. 10 is a table showing the presence or the absence of film defects when a hole transport layer is formed and the luminescent efficiency and the element lifetime of an organic EL element in Examples and Comparative Examples.

FIG. 12 is a table showing a low molecular material and a high molecular material capable of being applied to a hole injection layer, a hole transport layer, and a luminescence layer in a functional layer.

DESCRIPTION OF EXEMPLARY EMBODIMENTS

Hereinafter, description will be given of an embodiment in which the invention is embodied in accordance with drawings. Moreover, the used drawings are displayed by appropriately enlarging or reducing the size so as to become a state in which parts of description can be recognized.

Moreover, in the following aspects, for example, in a case where "on a substrate" is described, a case of arranging so as to contact on a substrate, a case of arranging on a substrate through another component, or a case of arranging so as to partially contact on a substrate and partially arranging on a substrate through another component is indicated.

First Embodiment

Figure 1:
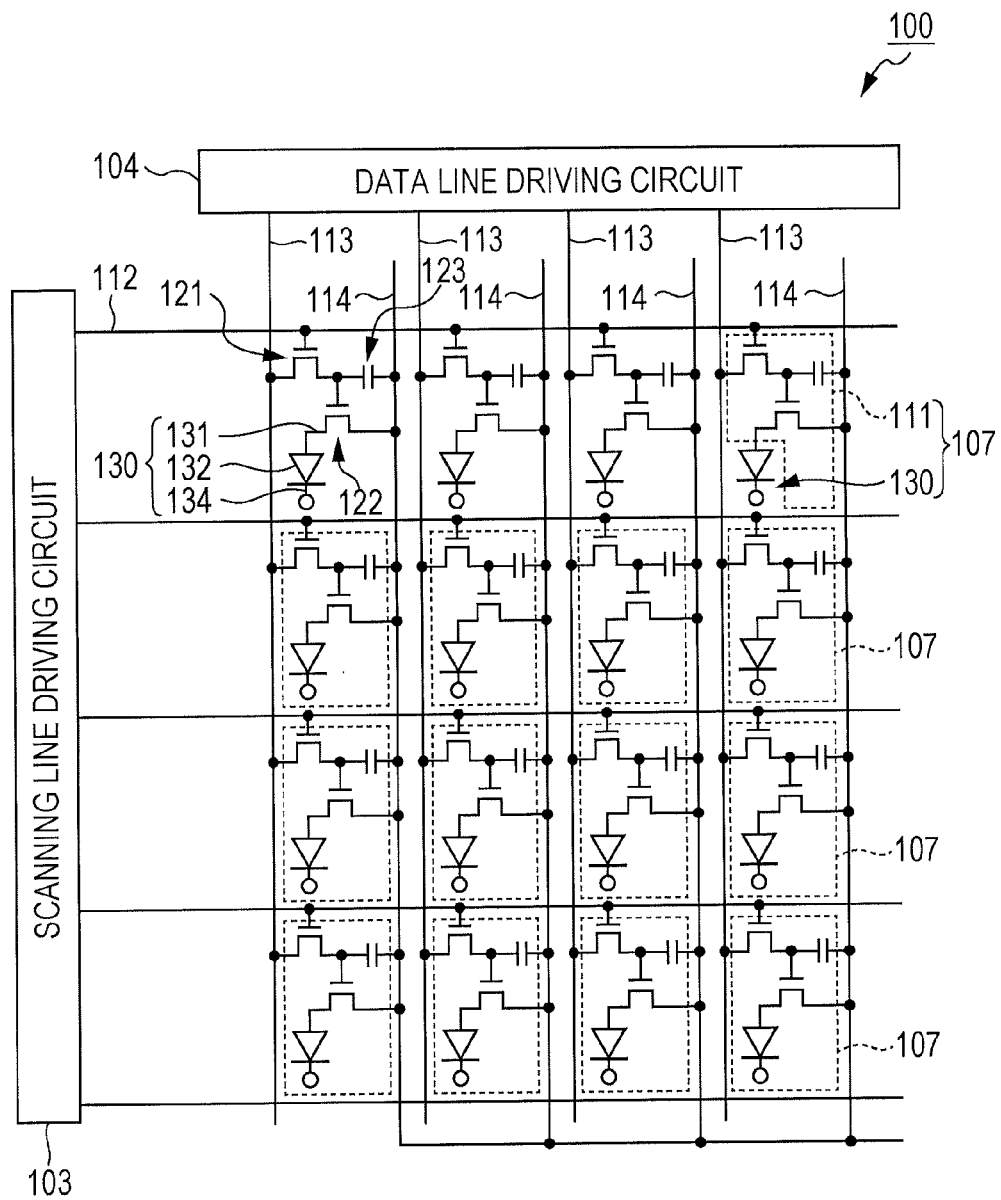
FIG. 1 is an equivalent circuit view showing an electrical configuration of an organic EL apparatus of a first embodiment.
Figure 2:
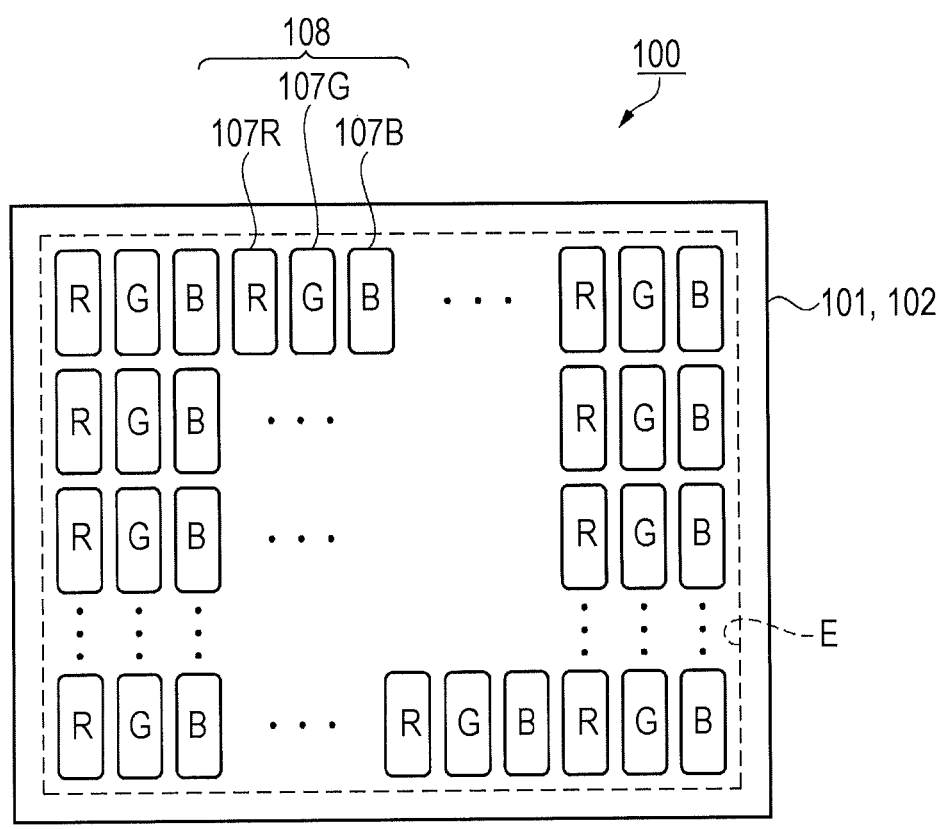
FIG. 2 is a schematic plan view showing a configuration of an organic EL apparatus of a first embodiment.
Figure 3:
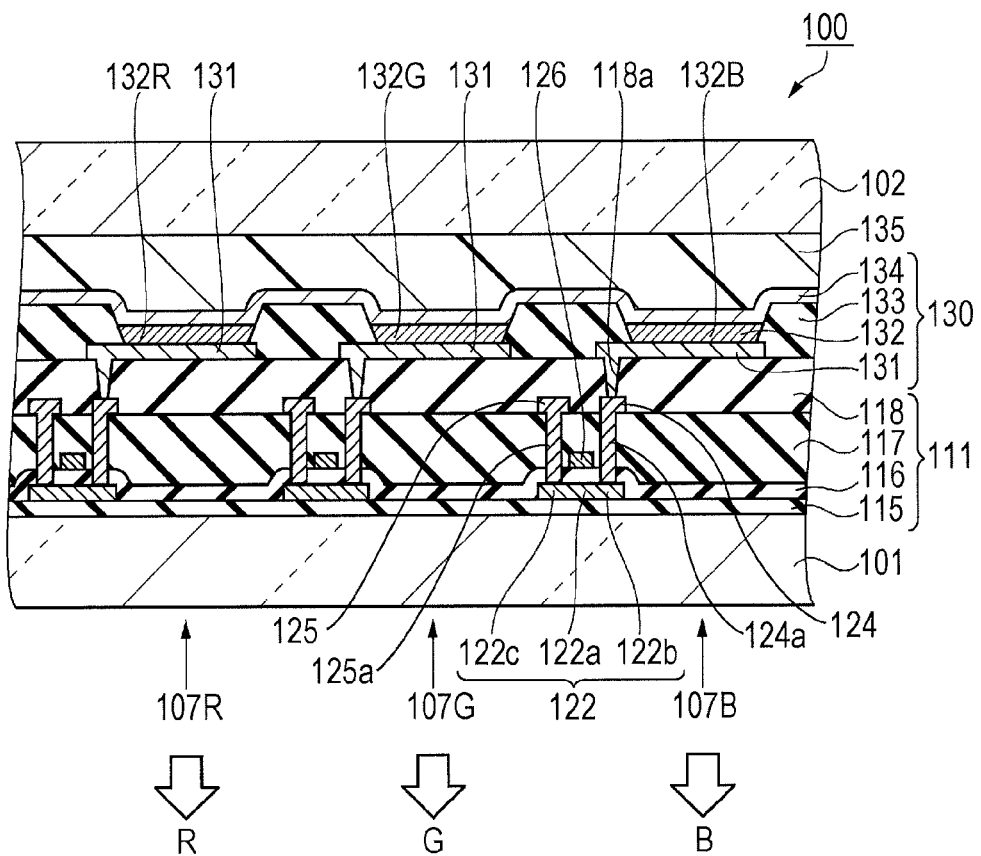
FIG. 3 is a schematic cross-sectional view showing a structure of a pixel of an organic EL apparatus of a first embodiment.

First, description will be given of an organic EL apparatus to which an organic EL element of the present embodiment is applied with reference to FIG. 1 to FIG. 3. FIG. 1 is an equivalent circuit view showing an electrical configuration of an organic EL apparatus, FIG. 2 is a schematic plan view showing a configuration of an organic EL apparatus, and FIG. 3 is a schematic cross-sectional view showing a structure of a pixel of an organic EL apparatus.

As shown in FIG. 1, an organic EL apparatus 100 in the embodiment has a plurality of scanning lines 112 and a plurality of data lines 113 which are crossed each other, and power lines 114 in parallel with respect to each of a plurality of data lines 113. The organic EL apparatus 100 has a scanning line driving circuit 103 connected to a plurality of scanning lines 112 and a data line driving circuit 104 connected to a plurality of data lines 113. In addition, the organic EL apparatus 100 has a plurality of luminescence pixels 107 arranged in a matrix state corresponding to each crossing part of a plurality of scanning lines 112 and a plurality of data lines 113.

The luminescence pixel 107 has an organic EL element 130 which is a luminescence element and a pixel circuit 111 controlling driving of the organic EL element 130.

The organic EL element 130 has a pixel electrode 131 as an anode, a counter electrode 134 as a cathode, and a functional layer 132 including a luminescence layer provided between the pixel electrode 131 and the counter electrode 134. Such an organic EL element 130 can be represented as a diode, electrically. Moreover, the counter electrode 134 is formed as a common electrode over a plurality of luminescence pixels 107.

The pixel circuit 111 includes a transistor for a switch 121, a transistor for driving 122, and a storage capacitor 123. Two transistors 121 and 122 can be configured using, for example, an n-channel type or p-channel type thin film transistor (TFT), or a MOS transistor.

A gate of the transistor for a switch 121 is connected to the scanning line 112, one of a source or a drain is connected to the data line 113, and the other of a source or a drain is connected to a gate of the transistor for driving 122.

One of a source or a drain of the transistor for driving 122 is connected to the pixel electrode 131 of the organic EL element 130 and the other of a source or a drain of the transistor for driving 122 is connected to the power line 114. The storage capacitor 123 is connected between the gate of the transistor for driving 122 and the power line 114.

When the scanning line 112 is driven and the transistor for a switch 121 turns to an ON state, a potential based on an image signal supplied from the data line 113 at this time is retained in the storage capacitor 123 through the transistor for a switch 121. An ON and OFF state of the transistor for driving 122 is determined in accordance with a potential of the storage capacitor 123, that is, a gate potential of the transistor for driving 122. Then, when the transistor for driving 122 turns to an ON state, a current having a magnitude in accordance with the gate potential flows from the power line 114 to the functional layer 132 sandwiched between the pixel electrode 131 and the counter electrode 134 through the transistor for driving 122. The organic EL element 130 produces luminescence in accordance with the magnitude of the current flowing through the functional layer 132.

Moreover, the configuration of the pixel circuit 111 is not limited thereto. For example, a transistor for controlling luminescence controlling the conduction between the transistor for driving 122 and the pixel electrode 131 may be provided between the transistor for driving 122 and the pixel electrode 131.

As shown in FIG. 2, the organic EL apparatus 100 has luminescence pixels 107R, 107G, and 107B in which the luminescence of red color (R), green color (G), and blue color (B) (the luminescence color) is obtained. Each of the luminescence pixels 107R, 107G, and 107B is in a substantially rectangular shape and is arranged in a matrix state in a display region E. The respective luminescence pixels 107R, 107G, and 107B are provided with the organic EL element 130 in which the luminescence of the corresponding colors is obtained. The luminescence pixels 107 in which the luminescence of the same colors is obtained are arrayed in a vertical direction (in a column direction or in a longitudinal direction of the luminescence pixel 107) on the drawing, and the luminescence pixels 107 of different luminescence colors are arrayed in the order of R, G, and B in a horizontal direction (in a row direction or in a short direction of the luminescence pixel 107) on the drawing. That is, the luminescence pixels 107R, 107G, and 107B of different luminescence colors are arranged in a so-called stripe system.

If such an organic EL apparatus 100 is used as a display apparatus, three luminescence pixels 107R, 107G, and 107B in which different luminescence colors are obtained are set to one display pixel unit 108 and the respective luminescence pixels 107R, 107G, and 107B are electrically controlled. Thereby, a full color display becomes possible.

Moreover, the planar shape and the arrangement of the luminescence pixels 107R, 107G, and 107B of different luminescence colors are not limited thereto, and, for example, may be an array of a delta system or a mosaic system. In addition, the luminescence pixel 107 in which the luminescence of, for example, yellow color (Y) is obtained other than red color (R), green color (G), and blue color (B) may be included without limiting to being provided with the luminescence pixels 107 corresponding to three colors of red color (R), green color (G), and blue color (B).

As shown in FIG. 3, in the organic EL apparatus 100, the organic EL element 130 has the pixel electrode 131 as an anode, a barrier wall 133 dividing the pixel electrode 131, the functional layer 132 including the luminescence layer formed on the pixel electrode 131. In addition, the organic EL element 130 has the counter electrode 134 as a common electrode formed to oppose to the pixel electrode 131 through the functional layer 132.

The barrier wall 133 consists of a photosensitive resin material having insulation properties such as a polyfunctional acrylic resin and is provided so as to cover a part of the periphery of the pixel electrode 131 configuring the luminescence pixel 107 and respectively divide a plurality of pixel electrodes 131.

The pixel electrode 131 is connected to one of three terminals of the transistor for driving 122 formed on an element substrate 101. A fixed potential, such as, for example, GND is given to the counter electrode 134. By applying a driving potential between the pixel electrode 131 and the counter electrode 134, the holes are injected from the pixel electrode 131 into the functional layer 132 and the electrons are injected from the counter electrode 134 into the functional layer 132. In the luminescence layer included in the functional layer 132, excitons are formed by the holes and the electrons injected, and when the excitons are disappeared (when the electrons and the holes are recombined), a part of the energy is released as fluorescence and phosphorescence. Hereinafter, the functional layers 132 of the organic EL element 130 provided corresponding to the luminescence pixels 107R, 107G, and 107B of red color (R), green color (G), and blue color (B) are sometimes called as the functional layers 132R, 132G, and 132B corresponding to the luminescence colors.

The organic EL apparatus 100 of the embodiment has a bottom emission type structure, and the driving current flows between the pixel electrode 131 and the counter electrode 134 and a light in which the luminescence is produced from the functional layers 132R, 132G, and 132B is reflected by the counter electrode 134 to take it out from the element substrate 101 side. Therefore, a transparent substrate such as a glass is used as an element substrate 101. In addition, for a sealing substrate 102 arranged opposite to the element substrate 101 through a sealing layer 135, either a transparent substrate or an opaque substrate can be used. As an opaque substrate, for example, a thermosetting resin, a thermoplastic resin, and the like are included, in addition to ceramics such as alumina or one in which a metal sheet such as stainless steel is subjected to an insulation treatment such as surface oxidation.

In the element substrate 101, the pixel circuit 111 driving the organic EL element 130 is provided. That is, a base insulating film 115 composed mainly of, for example, a silicon oxide ($SiO_2$) is formed on the surface of the element substrate 101 and a semiconductor layer 122a of the transistor for driving 122 is formed thereon. The semiconductor layer 122a consists of, for example, polysilicon. A gate insulating film 116 composed mainly of, for example, $SiO_2$ and/or SiN is formed on the surface of the semiconductor layer 122a.

In addition, in the semiconductor layer 122a, a region sandwiching the gate insulating film 116 and overlapping the gate electrode 126 is set to a channel region. Moreover, the gate electrode 126 is electrically connected to the scanning line 112 (not shown). A first interlayer insulating film 117 composed mainly of $SiO_2$ is formed by covering the semiconductor layer 122a and the gate electrode 126.

In addition, in the semiconductor layer 122a, while a low concentration source region and a high concentration source region 122c are provided on the source side of the channel region, a low concentration drain region and a high concentration drain region 122b are provided on the drain side of the channel region, that is, an LDD (Light Doped Drain) structure is formed. Among those, the high concentration source region 122c is connected to a source electrode 125 through a contact hole 125a which is opened over the gate insulating film 116 and the first interlayer insulating film 117. The source electrode 125 is configured as a part of the power line 114 (not shown). On the other hand, the high concentration drain region 122b is connected to a drain electrode 124 provided on the same wiring layer as the source electrode 125 through a contact hole 124a which is opened over the gate insulating film 116 and the first interlayer insulating film 117.

A second interlayer insulating film 118 is formed on the upper layer of the first interlayer insulating film 117 on which the source electrode 125 and the drain electrode 124 are formed. The second interlayer insulating film 118 is formed in order to eliminate the unevenness on the surface due to the transistor for driving 122 or the like configuring the pixel circuit 111, the source electrode 125, the drain electrode 124, or the like and is configured mainly of $SiO_2$ in the same way as the first interlayer insulating film 117, and is subjected to a flattening treatment such as CMP (Chemical Mechanical Polishing).

Then, the pixel electrode 131 is formed on the surface of the second interlayer insulating film 118 and is connected to the drain electrode 124 through the contact hole 118a provided on the second interlayer insulating film 118. That is, the pixel electrode 131 is connected to the high concentration drain region 122b of the semiconductor layer 122a through the drain electrode 124. The counter electrode 134 is connected to GND. Therefore, the driving current which is supplied from the power line 114 described above to the pixel electrode 131 by the transistor for driving 122 and flows between the pixel electrode 131 and the counter electrode 134 is controlled. Thereby, the pixel circuit 111 makes the desired organic EL element 130 produce luminescence and a color display becomes possible.

The respective functional layers 132R, 132G, and 132B consist of a plurality of thin film layers including the hole injection layer, the hole transport layer, and the luminescence layer and the hole injection layer, the hole transport layer, and the luminescence layer are laminated thereon in this order from the pixel electrode 131 side. In the embodiment, the hole injection layer, the hole transport layer, and the luminescence layer are formed using the liquid droplet discharging method (the ink jet method). A detailed configuration of the functional layer 132 will be described below, and at least one thin film layer among the hole injection layer, the hole transport layer, and the luminescence layer includes the low molecular material and the high molecular material. In the embodiment, the low molecular material indicates a monomer having a molecular weight of 10,000 or less and the high molecular material indicates a polymer having a weight average molecular weight of 10,000 or more.

The element substrate 101 having such an organic EL element 130 is fully sealed by the sealing substrate 102 without any space through the sealing layer 135 using a thermosetting type epoxy resin or the like as a sealing member.

The organic EL element 130 of the organic EL apparatus 100 of the embodiment is manufactured by using a method of manufacturing described below, and since the hole injection layer, the hole transport layer, and luminescence layer have respectively substantially constant film thicknesses and stable film shapes (cross sectional shapes), the desired luminescent efficiencies and luminescent lifetimes are respectively obtained in the functional layers 132R, 132G, and 132B in which the different luminescence colors are obtained.

Moreover, the organic EL apparatus 100 of the embodiment is not limited to bottom emission type, and for example, may have a top emission type structure in which the pixel electrode 131 is formed using a conductive material having light reflectivity, the counter electrode 134 as a cathode is formed using a transparent conductive material, and the luminescence from the organic EL element 130 is reflected by the pixel electrode 131 to take it out from the sealing substrate 102 side. In addition, in a case of having top emission type, the organic EL apparatus 100 may also have a configuration in which color filters corresponding to the luminescence colors of the organic EL element 130 are provided corresponding to each organic EL element 130. Furthermore, in a case where the organic EL apparatus 100 has a color filter, the organic EL apparatus 100 may also have a configuration in which a white luminescence is obtained from the organic EL element 130.

Figure 4:
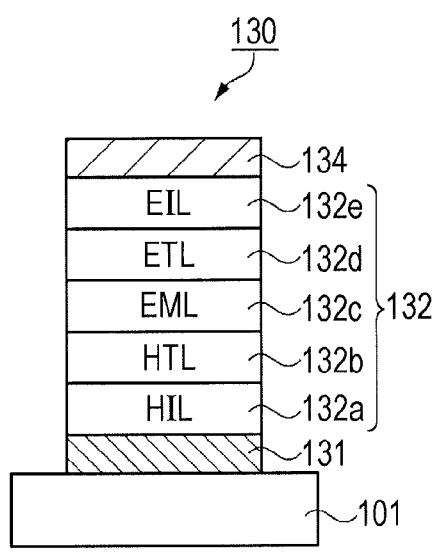
FIG. 4 is a typical cross-sectional view showing a configuration of an organic EL element.

Next, description will be given of a configuration of the organic EL element 130 with reference to FIG. 4. FIG. 4 is a typical cross-sectional view showing a configuration of an organic EL element.

As shown in FIG. 4, the organic EL element 130 has the pixel electrode 131 formed on the element substrate 101 as an anode, the counter electrode 134 arranged opposite to the pixel electrode 131 as a cathode, and the functional layer 132 sandwiched between the pixel electrode 131 and counter electrode 134. The functional layer 132 includes a hole injection layer 132a, a hole transport layer 132b, a luminescence layer 132c, an electron transport layer 132d, and an electron injection layer 132e which are laminated from the pixel electrode 131 side in order. Hereinafter, detailed description will be given of each configuration of the organic EL element 130.

Pixel Electrode

The pixel electrode 131 is an electrode for injecting the holes into the functional layer 132, and it is preferable to use a transparent electrode material having a big work function and excellent conductivity. As a transparent electrode material, for example, a metallic oxide such as ITO (Indium Tin Oxide), IZO (Indium Zinc Oxide), $In_2O_3$, $SnO_2$, fluorine-added $SnO_2$, Sb-added $SnO_2$, ZnO, Al-added ZnO, or Ga-added ZnO, Au, Pt, Ag, and Cu or an alloy including these, and the like are included. In addition, these can be used in combination of two or more kinds thereof. After a film is formed using these transparent electrode materials by deposition or various sputterings (RF magnetron sputtering), a pattern formation is performed by a photolithography method. The thickness of the pixel electrode 131 is not particularly limited, and is preferably from approximately 10 nm to 200 nm and more preferably from approximately 30 nm to 150 nm.

Hole Injection Layer

The hole injection layer 132a has a function of facilitating an injection of holes from the pixel electrode 131. As a material of such a hole injection layer 132a, an ion conductive hole injection material in which an electron-accepting dopant is added to a conductive high molecular material (or a conductive oligomer material) is suitably used so that the hole injection layer 132a can be formed by using the liquid phase process. As such an ion conductive hole injection material, for example, a polythiophone-based hole injection material such as poly(3,4-ethylenedioxythiophene)-poly(styrene sulfonate) (PEDOT/PSS) or a polyaniline-based hole injection material such as polyaniline-poly(styrene sulfonate) (PANI/PSS) can be used. These hole injection materials are applied by using the liquid phase process such as a liquid droplet discharging method (an ink jet method, or the like) or a screen printing. After applying, a film formation is performed by drying and firing. The thickness of such a hole injection layer 132a is not particularly limited, however, is preferably from approximately 5 nm to 150 nm and more preferably from approximately 10 nm to 100 nm.

Moreover, the hole injection layer 132a can also be omitted depending on a combination of the kind of a constituent material of the pixel electrode 131, the hole transport layer 132b, and the luminescence layer 132c configuring organic EL element 130, the thickness thereof, or the like.

Hole Transport Layer

The hole transport layer 132b is provided between the hole injection layer 132a and the luminescence layer 132c, in order to improve transport properties (injection properties) of the holes to the luminescence layer 132c and suppress the entering of electrons from the luminescence layer 132c into the hole injection layer 132a. That is, the hole transport layer 132b is for improving the luminescent efficiency due to the combination of the holes and the electrons in the luminescence layer 132c. In the embodiment, the hole transport layer 132b includes a hole transport material which is the low molecular material and the high molecular material. The hole transport material is not particularly limited, however, an amine compound can be used.

For example, TPD (N,N'-diphenyl-N,N'-bis(3-methylphenyl)-1,1'-biphenyl-4,4'-diamine), α-NPD (N,N'-diphenyl-N,N'-bis(1-naphthyl)-1,1'-biphenyl-4,4'-diamine), m-MTDATA (4,4',4''-tris(N-3-methylphenyl-N-phenylamino) triphenylamine), 2-TNATA (4,4',4''-tris(N,N-(2-naphthyl) phenylamino)triphenylamine), TCTA (tris-(4-carbazoyl-9-yl-phenyl)-amine, or the like can be used.

As the high molecular material, a polyparaphenylenevinylene derivative, a polyfluorene derivative, a polyaniline derivative, a polyvinyl carbazole derivative, a polythiophene derivative, polyethylene terephthalate (PET), polyethylene naphthalate (PEN), polyethylene sulfone (PES), polyolefin (PO), polyimide (PI), polyethylene, polypropylene, cellulose esters such as cellophane, cellulose diacetylate, cellulose triacetate, cellulose acetate butyrate, cellulose acetate propionate, cellulose acetate phthalate, or cellulose nitrate and a derivative thereof, polyvinylidene chloride, polyvinyl alcohol, polyethylene vinyl alcohol, syndiotactic polystyrene, polycarbonate, polymethyl pentene, polyether ketone, polyether sulfone, polysulfones, polyether ketone imide, polyamide, nylon, polymethylmethacrylate (PMMA), acryl, polyarylate, an organic-inorganic hybrid resin, or the like can be used. As a mixing ratio of the low molecular material to the high molecular material, it is possible to mix to be used in a range from 0.1 wt % to 99.9 wt % of the low molecular material as a weight ratio.

A mixture including these hole transport materials (the low molecular materials) and the high molecular material are also applied by using the liquid phase process such as a liquid droplet discharging method (an ink jet method) or a screen printing. After applying, a film formation is performed by drying and firing. In the embodiment, since the liquid droplet discharging method (the ink jet method) as the liquid phase process is used, the weight average molecular weight of the high molecular material is preferably from 10,000 to 300,000 and the mixing ratio of the low molecular material is preferably from 10 wt % to 90 wt %.

In this manner, an occurrence of a film formation failure due to an aggregation of the mixture of the low molecular material and the high molecular material when a film is formed is suppressed by using a hole transport layer forming material in which the low molecular material and the high molecular material are mixed, and thus a stable film formation structure can be obtained. The thickness of the hole transport layer 132b is not particularly limited, however, is preferably from approximately 5 nm to 100 nm and more preferably from approximately 10 nm to 50 nm.

Luminescence Layer

A material of the luminescence layer is not particularly limited, however, for example, it is preferable to include a luminescence material (a guest material) in which the luminescence of red color, green color, and blue color can be obtained and a host material in which a recombination of the injected holes and electrons can effectively be promoted.

As a guest material, for example, a phosphorescence luminescence material such as Ir(ppy)3 (Fac-tris(2-phenylpyridine)iridium), Ppy2Ir(acac) (bis(2-phenyl-pyridinate-N,C2)iridium(acetylacetonate)), Bt2Ir(acac) (bis(2-phenylbenzothiazolate-N,C2')iridium(III)(acetylacetonate)), Btp2Ir(acac) (bis(2,2'-benzothienyl)-pyridinate-N,C3) iridium(acetylacetonate), FIrpic (iridium-bis(4,6-difluorophenyl-pyridinate-N,C.2.)-picolinate), Ir(pmb)3 (iridium-tris(1-phenyl-3-methyl benzimidazoline-2-pyridine-C,C (2)')), FIrN4 (((iridium(III)-bis(4,6-difluoro phenylpyridinate)(5-(pyridine-2-yl)-tetrazolate)), Firtaz ((iridium(III)-bis(4,6-difluorophenyl pyridinate)(5-(pyridine-2-yl)-1,2,4-triazolate)), or PtOEP (2,3,7,8,12,13,17,18-octaethyl-21H, 23H-porphyrin, platinum (II)) or a fluorescence luminescence material such as $Alq_3$ (8-hydroxyquinolinate) aluminium, rubrene, perylene, 9,10-diphenyl anthracene, tetraphenyl butadiene, Nile Red, Coumarin 6, or Quinacridone can be used.

As a host material, for example, CBP (4,4'-bis(9-dicarbazoyl)-2,2'-biphenyl), BAlq (bis-(2-methyl-8-quinolinolate)-4-(phenylphenolate)aluminium), mCP (N,N-dicarbazolyl-3,5-benzene: a CBP derivative), CDBP (4,4'-bis(9-carbazolyl)-2,2'-dimethyl-biphenyl), DCB (N,N'-dicarbazolyl-1,4-dimethene-benzene), P06 (2,7-bis (diphenylphosphine oxide)-9,9-dimethylfluorene), SimCP (3,5-bis(9-carbazoyl)tetraphenyl silane), UGH3 (w-bis(triphenyl silyl)benzene), or the like can be used.

If such a guest material and a host material are used, the luminescence layer 132c can be formed by not only the liquid phase process but also the vapor phase process. The thickness of the luminescence layer 132c is not particularly limited, however, is preferably from approximately 5 nm to 100 nm.

Electron Transport Layer

The electron transport layer 132d has a function of transporting the electrons injected from the counter electrode 134 into the electron transport layer 132d to the luminescence layer 132c. In addition, the electron transport layer 132d has a function of blocking the holes passing through from the luminescence layer 132c to the electron transport layer 132d in some cases. A material of such an electron transport layer 132d is not particularly limited, however, for example, a quinoline derivative such as an organic metal complex having 8-quinolinol such as tris(8-quinolinolato)aluminium ($Alq_3$) or 8-quinolinolato lithium (Liq) or a derivative thereof as a ligand, an oxadiazole derivative such as 2-(4-tert-butylphenyl)-5-(4-biphenyl)-1,3,4-oxadiazole (tBu-PBD) or 2,5-bis(1-naphthyl)-1,3,4-oxadiazole (BND), a silole derivative, a pyridine derivative, a pyrimidine derivative, a quinoxaline derivative, an imidazole derivative, or the like is suitably used so as to be able to form the electron transport layer 132d by using the vapor phase process. In addition, these materials can be used in a combination of two or more kinds thereof.

The thickness of the electron transport layer 132d is not particularly limited, however, is preferably from approximately 1 nm to 100 nm and more preferably from approximately 5 nm to 50 nm.

Electron Injection Layer

The electron injection layer 132e has a function of improving an injection efficiency of the electrons from the counter electrode 134 into the electron transport layer 132d. A material of such an the electron injection layer 132e is not particularly limited, however, for example, an alkali metal, an alkaline earth metal, a rare earth metal, an alkali metal salt (oxide, fluoride, chloride, or the like), an alkaline earth metal salt (oxide, fluoride, chloride, or the like), a rare earth metal salt (oxide, fluoride, chloride, or the like), or the like can be used so as to be able to form the electron injection layer 132e by using the vapor phase process. The thickness of the electron injection layer 132e is not particularly limited, however, is preferably from approximately 0.01 nm to 100 nm and more preferably from approximately 0.1 nm to 10 nm.

Moreover, the functional layer 132 is not limited to the configuration described above and may include an organic layer or an inorganic layer for controlling a flow of the carriers (the holes or the electrons).

Counter Electrode

The counter electrode 134 is an electrode for injecting the electrons into the functional layer 132, and it is preferable to use a material having a small work function. In addition, for example, Li, Mg, Ca, Sr, La, Ce, Er, Eu, Sc, Y, Yb, Ag, Cu, Al, Cs, Rb, or Au or an alloy including these, or the like can also be used so as to be able to form the counter electrode 134 by using the vapor phase process in a cathode forming process described below. In addition, these materials can also be used in a combination of two or more kinds thereof (for example, a laminated body having a plurality of layers or the like). The thickness of the counter electrode 134 is not particularly limited, however, for example, is from 100 nm to 1,000 nm.

Figure 5:
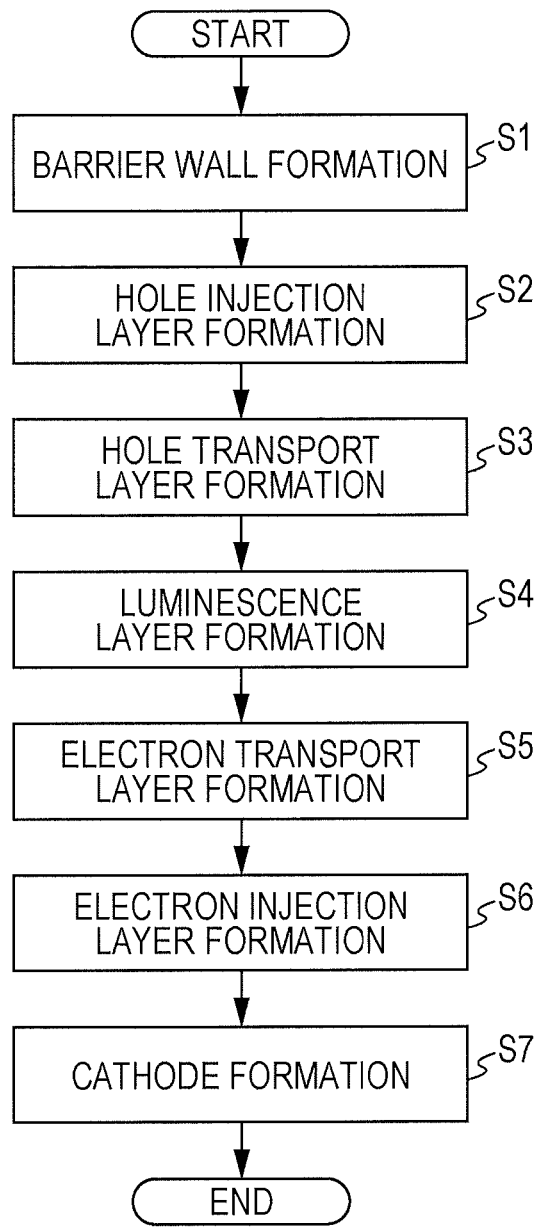
FIG. 5 is a flow chart showing a method of manufacturing an organic EL element.

Next, more specifically, description will be given of a method of manufacturing the organic EL element 130 with reference to FIG. 5 to FIG. 7H. FIG. 5 is a flow chart showing a method of manufacturing an organic EL element and FIGS. 6A to 6E and FIGS. 7F to 7H are schematic cross-sectional views showing a method of manufacturing an organic EL element. Moreover, hereinafter, as a description of a method of manufacturing the organic EL element 130, description will be given of processes after the pixel electrode 131 is formed in order. In addition, the pixel electrode 131 provided on the element substrate 101, the pixel circuit 111 connecting to the pixel electrode 131, and the like can be formed by using a well-known method as described above.

As shown in FIG. 5, a method of manufacturing the organic EL element 130 of the embodiment has a barrier wall forming process (Step S1), a hole injection layer forming process (Step S2), a hole transport layer forming process (Step S3), a luminescence layer forming process (Step S4), an electron transport layer forming process (Step S5), an electron injection layer forming process (Step S6), and a cathode forming process (Step S7).

Figure 6A:
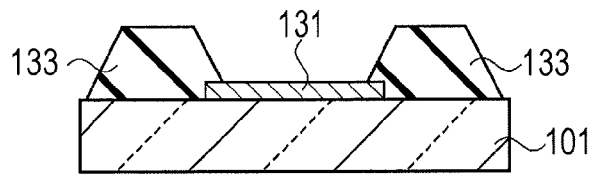
FIGS. 6A to 6E are schematic cross-sectional views showing a method of manufacturing an organic EL element.

In Step S1 in FIG. 5, the barrier wall 133 is formed so as to cover an outer edge of the pixel electrode 131 and divide the pixel electrode 131, as shown in FIG. 6A. As a method of forming the barrier wall 133, for example, a photosensitive resin layer is formed by applying a photosensitive resin material having insulation properties such as a polyfunctional acrylic resin onto the surface of the element substrate 101 on which the pixel electrode 131 is formed with a thickness of approximately from 1 µm to 3 µm and then drying. As a method of applying the photosensitive resin material, a transfer method, a slit coat method, and the like are included. Then, the barrier wall 133 having the cross section surface in a trapezoidal shape is formed by exposing the photosensitive resin layer using a mask for exposure corresponding to the shape of the luminescence pixel 107 (refer to FIG. 2) and then developing. Then, the element substrate 101 forming the barrier wall 133 is subjected to the surface treatment so that the surface of the pixel electrode 131 exhibits suitable lyophilicity with respect to a functional liquid (ink) as a solution including the functional layer forming material described below and the surface of the barrier wall 133 similarly exhibits liquid repellency with respect to the functional liquid (ink). Specifically, firstly, the element substrate 101 is subjected to a plasma treatment using an oxygen ($O_2$) gas as a treatment gas and the surface of the pixel electrode 131 is made to be lyophilicity. Subsequently, the element substrate 101 is subjected to a plasma treatment using a fluorine-based treatment gas such as, for example, $CF_4$ and the surface of the barrier wall 133 is made to be liquid repellency. Moreover, the barrier wall 133 may be formed by applying the photosensitive resin material including a liquid repellent material such as a fluorine-based compound. In a case of using the photosensitive resin material including the liquid repellent material, it is preferable that the element substrate 101 be subjected to a UV ozone treatment in order to remove a residue on the pixel electrode 131 after the barrier wall 133 is formed. Hereinafter, a region including the pixel electrode 131 divided by the barrier wall 133 is referred as a film forming region. Then, processing goes to Step S2.

Figure 6B:
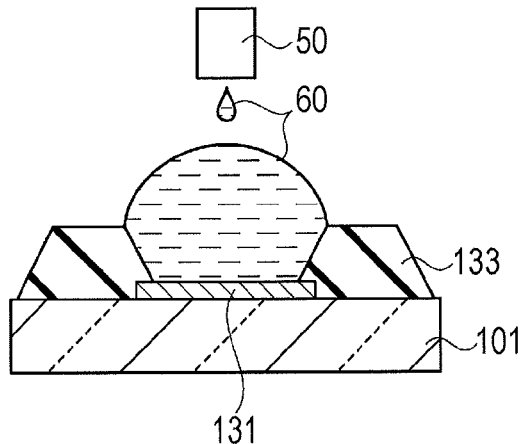
Figure 6C:
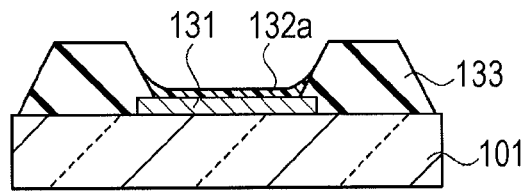

In Step S2 in FIG. 5, the hole injection layer 132a is formed by the liquid phase process. Specifically, firstly, the functional liquid (ink) 60 including the hole injection material described above is, for example, discharged to the film forming region from a nozzle of an ink jet head 50, as shown in FIG. 6B. It is possible to accurately discharge the functional liquid (ink) 60 with the predetermined amount as a droplet into the film forming region by using the ink jet head 50. The discharged functional liquid (ink) 60 is wetly spread on the surface of the pixel electrode 131 which is made to be lyophilicity and is raised by the interfacial surface tension in the film forming region surrounded by the barrier wall 133 which is made to be liquid repellency. By heating and drying the element substrate 101 on which the functional liquid (ink) 60 is applied, for example, under an air atmosphere, the hole injection layer 132a is formed on the pixel electrode 131, as shown in FIG. 6C. Since the surface of the pixel electrode 131 has been made to be lyophilicity, the hole injection layer 132a is formed in the film forming region without unevenness. Moreover, in the embodiment, although the hole injection layer 132a consisting of the same material is formed in each film forming region on the element substrate 101, the material of the hole injection layer 132a may be changed depending on the luminescence colors corresponding to the luminescence layer 132c which is formed later. Then, processing goes to Step S3.

Figure 6D:
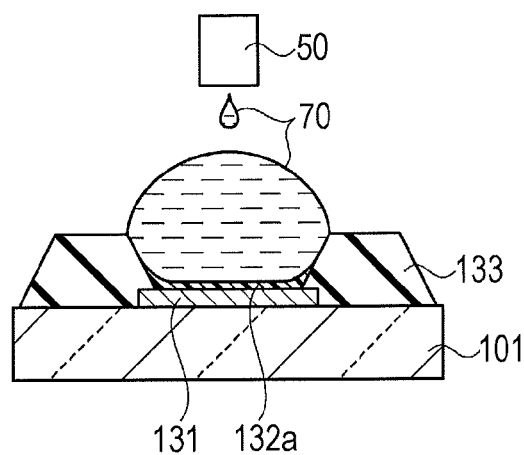
Figure 6E:
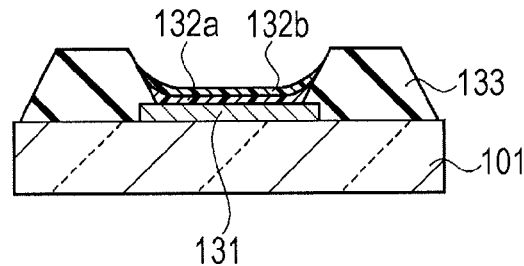

In Step S3 in FIG. 5, the hole transport layer 132b is formed by the liquid phase process. Specifically, firstly, the functional liquid (ink) 70 including the hole transport material which is the low molecular material and the high molecular material described above is discharged to the film forming region from a nozzle of the ink jet head 50, as shown in FIG. 6D. The functional liquid (ink) 70 with the predetermined amount discharged as a droplet is raised by the interfacial surface tension in the film forming region surrounded by the barrier wall 133. By heating and drying the element substrate 101 on which the functional liquid (ink) 70 is applied, for example, under a nitrogen atmosphere, the hole transport layer 132b is formed on the hole injection layer 132a, as shown in FIG. 6E. Since the functional liquid (ink) 70 including the hole transport material which is the low molecular material and the high molecular material is used, the viscosity of the functional liquid (ink) 70 increases in a heating and drying process of the functional liquid (ink) 70, an aggregation of the mixture of the low molecular material and the high molecular material is suppressed, and the hole transport layer 132b is formed in the film forming region without unevenness even if the surface of the hole injection layer 132a including the high molecular material does not exhibit lyophilicity with respect to the functional liquid (ink) 70. Then, processing goes to Step S4.

Figure 7F:
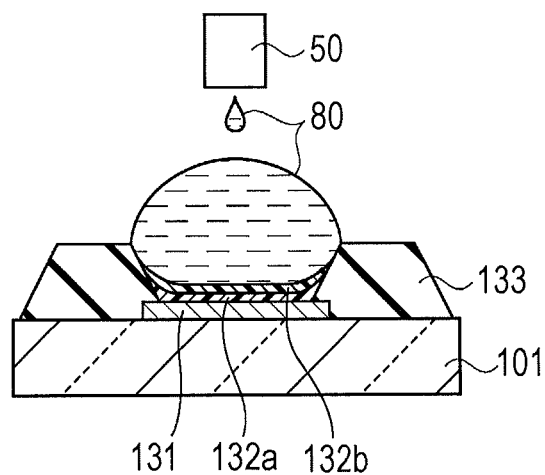
FIGS. 7F to 7H are schematic cross-sectional views showing a method of manufacturing an organic EL element.
Figure 7G:
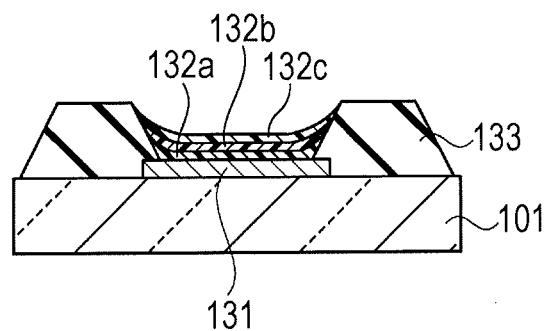

In Step S4 in FIG. 5, the luminescence layer 132c is formed by the liquid phase process. Specifically, firstly, the functional liquid (ink) 80 including the luminescence layer forming material described above is discharged to the film forming region from a nozzle of the ink jet head 50, as shown in FIG. 7F. The functional liquid (ink) 80 with the predetermined amount discharged as a droplet is raised by the interfacial surface tension in the film forming region surrounded by the barrier wall 133. As a method of drying the applied functional liquid (ink) 80, it is preferable to use a decompression drying method capable of relatively uniformly drying a solvent component, compared to general heating and drying. The functional liquid (ink) 80 is evenly applied with the predetermined amount in the film forming region. Therefore, the luminescence layer 132c formed after drying has substantially constant film thickness and stable film shape (cross sectional shape) in the film forming region, as shown in FIG. 7G. Then, processing goes from Step S5 to Step S7.

Figure 7H:
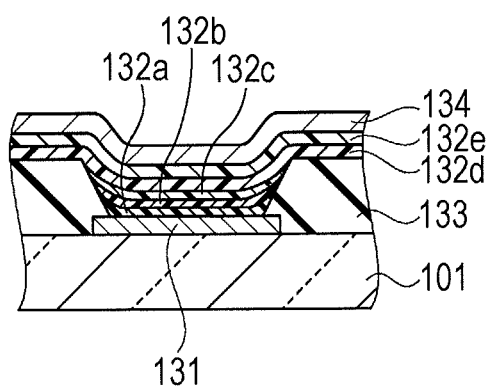

In Step S5 to Step S7 in FIG. 5, the electron transport layer 132d, the electron injection layer 132e, and the counter electrode 134 as a cathode are formed by the vapor phase process. Specifically, the films are sequentially formed using the materials of each layer described above, for example, by a vacuum deposition method and each layer is formed by laminating, as shown in FIG. 7H. In particular, it is preferable to form the counter electrode 134 by a vacuum deposition method in terms of preventing a damage by heat of the functional layer 132. In addition, in order to prevent a decrease in luminescence function or luminescent lifetime of the functional layer 132 due to water or a gas such as oxygen entering into the functional layer 132 from outside, the film may be formed using an inorganic material such as, for example, an oxide or a nitride of silicon or an oxynitride of silicon having gas barrier properties so as to cover the surface of the counter electrode 134. Thereby, the organic EL element 130 is produced.

The functional liquid (ink) 70 discharged from a nozzle of the ink jet head 50 includes a good solvent capable of dissolving 0.1 g/L or more of the high molecular material. In order to stably discharge the functional liquid (ink) 70 from the nozzle as a droplet, the viscosity of the functional liquid (ink) 70 is preferably lower than 20 cp and more preferably 10 cp or lower. In addition, the boiling point of the good solvent is preferably 200° C. or higher. When the boiling point (bp) of the good solvent is below 200° C., the evaporation of the solvent easily proceeds inside the nozzle and the high molecular material is gelled, and thus the clogging of the nozzle occurs, the discharge amount of droplet is varied, the variation in the impact position occurs due to the flying curving of a droplet, or the like, and it is therefore not preferable. As a good solvent, for example, an aromatic-based solvent such as 1,4-diisopropylbenzene, 2-isopropylnaphthalene, or 1-phenylhexane, an aromatic ether such as dibenzylether, or an aliphatic ether such as diethyleneglycoldibutylether or diethyleneglycolbutylmethylether can be used. Moreover, the solvent included in the functional liquid (ink) 70 is not limited to one kind and may included a plurality of kinds of solvents.

An effect of the first embodiment is as follow.

(1) According to the organic EL element 130 and the method of manufacturing the same, among the functional layers 132, the hole injection layer 132a, the hole transport layer 132b, and the luminescence layer 132c are formed by the liquid phase process (the liquid droplet discharging method; the ink jet method) and the electron transport layer 132d and the electron injection layer 132e are formed by the vapor phase process (a vacuum deposition method). Therefore, since the liquid phase process is used for the layer such as the luminescence layer 132c which is required to separately apply, it is possible to effectively manufacture the organic EL element 130, compared to a case of forming all of each of the thin film layers included in the functional layer 132 by using the vapor phase process.

(2) In addition, the hole transport layer 132b formed on the hole injection layer 132a is formed using the functional liquid (ink) 70 including the hole transport material which is the low molecular material and the high molecular material. The molecular weight of the low molecular material is 10,000 or less, the weight average molecular weight of the high molecular material is from 10,000 to 300,000, and the mixing ratio of the low molecular material to the total amount of the low molecular material and the high molecular material included in the functional liquid (ink) 70 is in a range from 10 wt % to 90 wt %. Therefore, the viscosity of the functional liquid (ink) 70 increases in a heating and drying process of the functional liquid (ink) 70, an aggregation of the mixture of the low molecular material and the high molecular material is suppressed, and the hole transport layer 132b can be formed without unevenness even if the surface of the hole injection layer 132a including the high molecular material does not exhibit lyophilicity with respect to the functional liquid (ink) 70. Therefore, the organic EL element 130 provided with such a functional layer 132 can realize the desired luminescent efficiency and luminescent lifetime.

(3) By providing with the organic EL element 130 on the luminescence pixel 107, the organic EL apparatus 100 which both excellent display quality (luminescence characteristics) and reliability quality (luminescent lifetime) can be achieved can be provided.

Second Embodiment

Organic EL Apparatus

Figure 8:
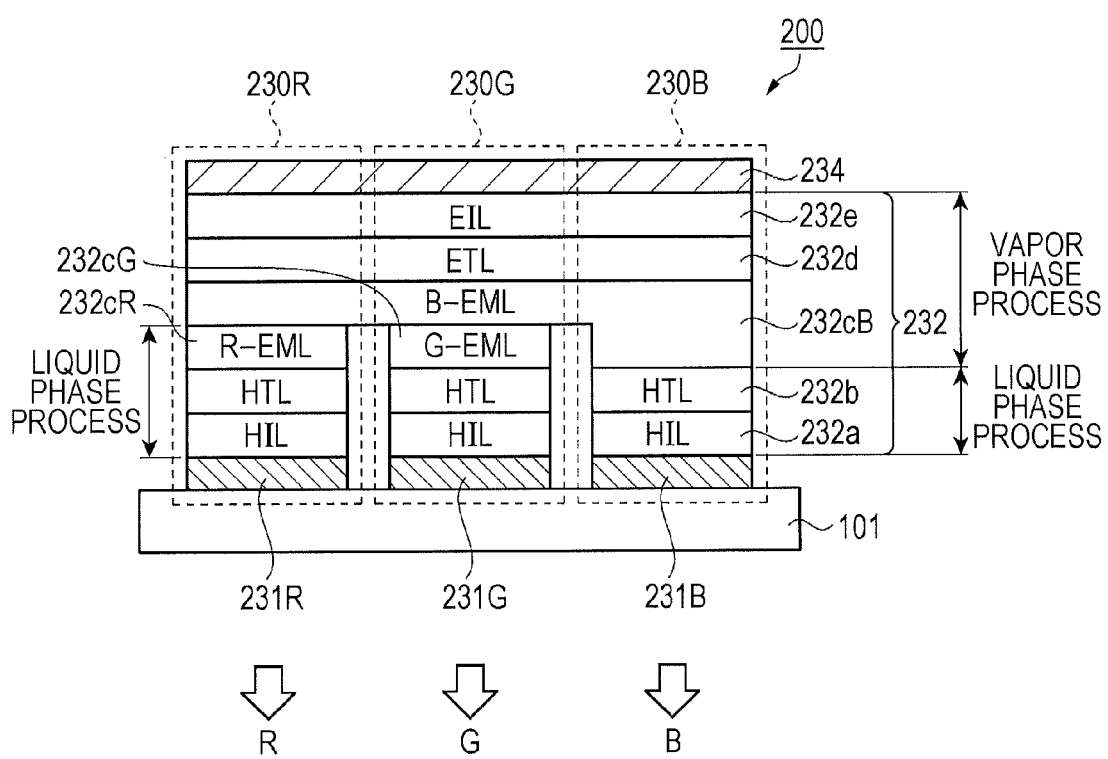
FIG. 8 is a typical cross-sectional view showing a configuration of an organic EL element in an organic EL apparatus of a second embodiment.

Next, description will be given of an organic EL apparatus of a second embodiment to which the organic EL element of the invention is applied with reference to FIG. 8. FIG. 8 is a typical cross-sectional view showing a configuration of an organic EL element in an organic EL apparatus of the second embodiment. The organic EL apparatus of the second embodiment is one which is different in a configuration of the organic EL element provided on each luminescence pixels 107R, 107G, and 107B with respect to the organic EL apparatus 100 of the first embodiment. Detailed description will be omitted by using the same references for the same configuration as the organic EL apparatus 100.

As shown in FIG. 8, an organic EL apparatus 200 of the embodiment has an organic EL element 230R in which the luminescence of red color is obtained, an organic EL element 230G in which the luminescence of green color is obtained, and an organic EL element 230B in which the luminescence of blue color is obtained, which are provided on the element substrate 101. The organic EL apparatus 200 is a bottom emission system in which the luminescence from each of the organic EL elements 230R, 230G, and 230B is emitted from the element substrate 101 side. That is, the organic EL element 230R is provided on the luminescence pixel 107R, the organic EL element 230G is provided on the luminescence pixel 107G, and the organic EL element 230B is provided on the luminescence pixel 107B.

The organic EL element 230R in which the luminescence of red color is obtained has a pixel electrode 231R as an anode, a counter electrode 234 arranged opposite to the pixel electrode 231R as a cathode, a hole injection layer 232a, a hole transport layer 232b, a luminescence layer 232cR of red (R), a luminescence layer 232cB of blue (B), an electron transport layer 232d, and an electron injection layer 232e laminated from the pixel electrode 231R side in order between the pixel electrode 231R and the counter electrode 234.

The organic EL element 230G in which the luminescence of green color is obtained has the pixel electrode 231G as an anode, the counter electrode 234 arranged opposite to the pixel electrode 231G as a cathode, the hole injection layer 232a, the hole transport layer 232b, a luminescence layer 232cG of green (G), the luminescence layer 232cB of blue (B), the electron transport layer 232d, and the electron injection layer 232e laminated from the pixel electrode 231G side in order between the pixel electrode 231G and the counter electrode 234.

The organic EL element 230B in which the luminescence of blue color is obtained has the pixel electrode 231B as an anode, the counter electrode 234 arranged opposite to the pixel electrode 231B as a cathode, the hole injection layer 232a, the hole transport layer 232b, the luminescence layer 232cB of blue (B), the electron transport layer 232d, and the electron injection layer 232e laminated from the pixel electrode 231B side in order between the pixel electrode 231B and the counter electrode 234.

The pixel electrodes 231R, 231G, and 231B are respectively formed using a transparent electrode material such as, for example, ITO which has the same big work function as the pixel electrode 131 of the first embodiment by the vapor phase process.

The counter electrode 234 is formed using an electrode material such as, for example, an alloy of Mg and Ag which has the same small work function as the counter electrode 134 of the first embodiment as a cathode in common with the organic EL elements 230R, 230G, and 230B by the vapor phase process.

Though an illustration is omitted in FIG. 8, the pixel electrodes 231R, 231G, and 231B are respectively divided by the barrier wall 133 which is subjected to a surface treatment in the same way as the first embodiment. The hole injection layer 232a and the hole transport layer 232b are separately applied in order and formed in the film forming region divided by the barrier wall 133 corresponding to each of the pixel electrodes 231R, 231G, and 231B by the liquid phase process. In addition, the luminescence layer 232cR is separately applied and formed on the hole transport layer 232b corresponding to the pixel electrode 231R by the liquid phase process and the luminescence layer 232cG is separately applied and formed on the hole transport layer 232b corresponding to the pixel electrode 231G by the liquid phase process.

On the other hand, the luminescence layer 232cB of blue (B), the electron transport layer 232d, and the electron injection layer 232e are formed over three organic EL elements 230R, 230G, and 230B by commonly using the vapor phase process. The vapor phase process in the embodiment, for example, is a vacuum deposition method. In addition, the liquid phase process, for example, is the liquid droplet discharging method (the ink jet method).

The luminescence layer 232cB of blue (B) formed over three organic EL elements 230R, 230G, and 230B by commonly using the vapor phase process is configured by including a host material having electron transport properties. Therefore, even if the luminescence layer 232cB of blue (B) is laminated on the luminescence layer 232cR of red (R), the luminescence of red color is obtained in the organic EL element 230R. In addition, even if the luminescence layer 232cB of blue (B) is laminated on the luminescence layer 232cG of green (G), the luminescence of green color is obtained in the organic EL element 230G. The luminescence of blue color is naturally obtained from the organic EL element 230B having the luminescence layer 232cB of blue (B).

In respective organic EL elements 230R, 230G, and 230B, the hole transport layer 232b includes the hole transport material which is the low molecular material and the high molecular material in the same way as the hole transport layer 132b of the first embodiment. In other words, by applying the functional liquid (ink) 70 including the hole transport material which is the low molecular material and the high molecular material onto the film forming region, and then heating and drying the region, the hole transport layer 232b is formed without unevenness in the film forming region. As a hole transport material and a high molecular material, the materials described in the first embodiment can be used.

According to the organic EL apparatus 200 and the method of manufacturing the same of the second embodiment, the respective hole transport layers 232b of the organic EL elements 230R, 230G, and 230B are formed using the functional liquid (ink) 70 including the hole transport material which is the low molecular material and the high molecular material by the liquid droplet discharging method (the ink jet method). In addition, the luminescence layer 232cB of the organic EL element 230B in which the luminescence of blue color is obtained is formed by using the vapor phase process. Therefore, since even lower molecular luminescence material (the guest material) and host material can be employed, compared to a case where the luminescence layer 232cB of blue (B) is formed by using the liquid phase process as the first embodiment, the luminescent efficiency and the luminescent lifetime in the organic EL element 230B in which the luminescence of blue color is obtained can further be improved.

Next, more specifically, by giving Examples and Comparative Examples in the method of manufacturing the organic EL element, description will be given of evaluation results thereof. As to Examples and Comparative Examples in the embodiment, description will be given of a method of forming the functional layer 232 of the organic EL element 230B in which the luminescence of blue color is obtained in the second embodiment as an example. The point in which an action and effect in forming of the hole transport layer are more certainly reflected is considered in the second embodiment in which the luminescence layer 232cB is formed on the hole transport layer 232b including the low molecular material and the high molecular material by the vapor phase process more than the first embodiment in which the luminescence layer 132c is formed on the hole transport layer 132b including the low molecular material and the high molecular material by the liquid phase process.

FIG. 9 is a table showing a material constitution of a hole transport layer in Examples and Comparative Examples. FIG. 10 is a table showing the presence or the absence of film defects when a hole transport layer is formed, and the luminescent efficiency and the element lifetime of an organic EL apparatus in Examples and Comparative Examples.

Example 1

1-1 In the method of manufacturing the organic EL element 230B of Example 1, first, a PEDOT/PSS water dispersion solution having a concentration of 1 wt % was applied onto the film forming region surrounded by the barrier wall 133 by the liquid droplet discharging method. After the applied PEDOT/PSS water dispersion solution was dried, the heat treatment was performed under an air atmosphere to form the hole injection layer 232*a* having a thickness of approximately 50 nm configuring of PEDOT/PSS on the pixel electrode 231B.

1-2 Next, α-NPD which is the hole transport material of the low molecular material and polyvinyl carbazole (PVK) which is the high molecular material were mixed and the functional liquid (ink) 70 contained with a concentration of 0.5 wt % in tetralin as a solvent was prepared. As shown in FIG. 9, the mixing ratio of α-NPD was 10 wt % and the mixing ratio of PVK was 90 wt %, to the total solid content weight. In addition, the weight average molecular weight of PVK was set to approximately 10,000. The boiling point (bp) of tetralin as a solvent was approximately 206° C. After the functional liquid (ink) 70 was applied onto the film forming region by the liquid droplet discharging method and then dried under a decompression condition of 1 Pa, the heat treatment was performed at 100° C. for 20 minutes under a nitrogen atmosphere to form the hole transport layer 232*b* having a thickness of approximately 40 nm on the hole injection layer 232*a*.

1-3 Next, the luminescence layer 232*c*B of blue color having a thickness of approximately 20 nm was formed by a vacuum deposition method. For the luminescence layer 232*c*B of blue color, a styryl derivative represented by the following formula (1) was used as a luminescence material (a guest material) and an anthracene derivative represented by the following formula (2) was used as a host material. The content of the guest material occupying in the host material was 5 wt % as a weigh ratio.

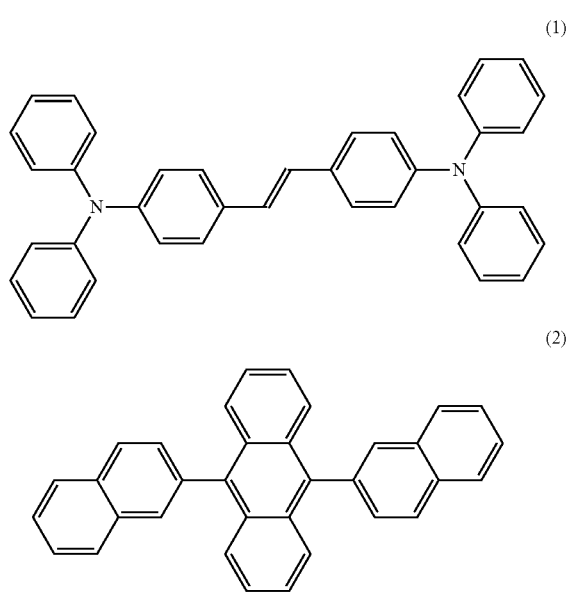

(1)

(2)

1-4 Next, the film was formed on the luminescence layer 232*c*B of the blue color by the vacuum deposition method so that the thickness of Alq$_3$ was 20 nm and this film was set to the electron transport layer 232*d*. Subsequently, the film was formed so that the thickness of LiF was 5 nm by the vacuum deposition method and this film was set to the electron injection layer 232*e*. Furthermore, the film was formed so that the thickness of Al (aluminium) was 150 nm by the vacuum deposition method and this film was set to the counter electrode 234.

Example 2

The method of manufacturing the organic EL element 230B of Example 2 was a method in which the mixing ratio of α-NPD which is the low molecular material to PVK which is the high molecular material in forming the hole transport layer 232*b* was different with respect to Example 1 and the configuration of other layers was the same as that of Example 1. Specifically, α-NPD was set to 30 wt % and PVK was set to 70 wt % (refer to FIG. 9).

Example 3

The method of manufacturing the organic EL element 230B of Example 3 was a method in which the mixing ratio of α-NPD which is the low molecular material to PVK which is the high molecular material in forming the hole transport layer 232*b* was different with respect to Example 1 and the configuration of other layers was the same as that of Example 1. Specifically, α-NPD was set to 60 wt % and PVK was set to 40 wt % (refer to FIG. 9).

Example 4

The method of manufacturing the organic EL element 230B of Example 4 was a method in which the mixing ratio of α-NPD which is the low molecular material to PVK which is the high molecular material in forming the hole transport layer 232*b* was different with respect to Example 1 and the configuration of other layers was the same as that of Example 1. Specifically, α-NPD was set to 90 wt % and PVK was set to 10 wt % (refer to FIG. 9).

Example 5

The method of manufacturing the organic EL element 230B of Example 5 was a method in which the weight average molecular weight of PVK which is the high molecular material in forming the hole transport layer 232*b* was different with respect to Example 1 and the configuration of other layers was the same as that of Example 1. Specifically, the weight average molecular weight of PVK was set to 100,000 (refer to FIG. 9).

Example 6

The method of manufacturing the organic EL element 230B of Example 6 was a method in which the weight average molecular weight of PVK which is the high molecular material in forming the hole transport layer 232*b* was different with respect to Example 2 and the configuration of other layers was the same as that of Example 2. Specifically, the weight average molecular weight of PVK was set to 100,000 (refer to FIG. 9).

Example 7

The method of manufacturing the organic EL element 230B of Example 7 was a method in which the weight average molecular weight of PVK which is the high molecular material in forming the hole transport layer 232*b* was different with respect to Example 3 and the configuration of other layers was the same as that of Example 3. Specifically, the weight average molecular weight of PVK was set to 100,000 (refer to FIG. 9).

Example 8

The method of manufacturing the organic EL element 230B of Example 8 was a method in which the weight average molecular weight of PVK which is the high molecular material in forming the hole transport layer 232b was different with respect to Example 4 and the configuration of other layers was the same as that of Example 4. Specifically, the weight average molecular weight of PVK was set to 100,000 (refer to FIG. 9).

Example 9

The method of manufacturing the organic EL element 230B of Example 9 was a method in which the weight average molecular weight of PVK which is the high molecular material in forming the hole transport layer 232b was different with respect to Example 3 and Example 7 and the configuration of other layers was the same as those of Example 3 and Example 7. Specifically, the weight average molecular weight of PVK was set to 300,000 (refer to FIG. 9).

Example 10

The method of manufacturing the organic EL element 230B of Example 10 was a method in which the weight average molecular weight of PVK which is the high molecular material in forming the hole transport layer 232b was different with respect to Example 4 and Example 8 and the configuration of other layers was the same as those of Example 4 and Example 8. Specifically, the weight average molecular weight of PVK was set to 300,000 (refer to FIG. 9).

Comparative Example 1

The method of manufacturing the organic EL element 230B of Comparative Example 1 was a method in which the mixing ratio of α-NPD which is the low molecular material to PVK which is the high molecular material in forming the hole transport layer 232b was different with respect to Example 1 and the configuration of other layers was the same as that of Example 1. Specifically, α-NPD was set to 100 wt % and PVK was set to 0 wt % (refer to FIG. 9). In other words, the hole transport layer 232b in the functional layer 232 in Comparative Example 1 does not include the high molecular material.

Comparative Example 2

The method of manufacturing the organic EL element 230B of Comparative Example 2 was a method in which the mixing ratio of α-NPD which is the low molecular material to PVK which is the high molecular material in forming the hole transport layer 232b was different with respect to Example 1 and the configuration of other layers was the same as that of Example 1. Specifically, α-NPD was set to 0 wt % and PVK was set to 100 wt % (refer to FIG. 9). In other words, the hole transport layer 232b in the functional layer 232 in Comparative Example 2 does not include the low molecular material.

Comparative Example 3

The method of manufacturing the organic EL element 230B of Comparative Example 3 was a method in which the weight average molecular weight of PVK which is the high molecular material in forming the hole transport layer 232b was different with respect to Example 3 and Example 7 and the configuration of other layers was the same as those of Example 3 and Example 7. Specifically, the weight average molecular weight of PVK was set to 500,000 (refer to FIG. 9).

In Example 1 to Example 10 and Comparative Example 1 to Comparative Example 3, the presence or the absence of film defects when the hole transport layer 232b was formed, and the luminescent efficiency (Cd/A) and the element lifetime (LT50) in the organic EL element 230B were evaluated. In the evaluations of the luminescent efficiency (Cd/A) and the element lifetime (LT50), a level in Comparative Example 1 was set to "1.0" and other Examples 1 to Example 10, Comparative Example 2, and Comparative Example 3 were relatively evaluated. As to the element lifetime (LT50), by producing luminescent from the organic EL element 230B so that the luminescence brightness was 1,000 Cd/m$^2$, an energizing time (luminescent lifetime) until the luminescence brightness was halved was relatively evaluated. The evaluation results are shown in FIG. 10. In addition, FIG. 11A is a photo showing a state of a film formation of a hole transport layer in Comparative Example 1 and FIG. 11B is a photo showing a state of a film formation of a hole transport layer in Example.

Figure 11A:
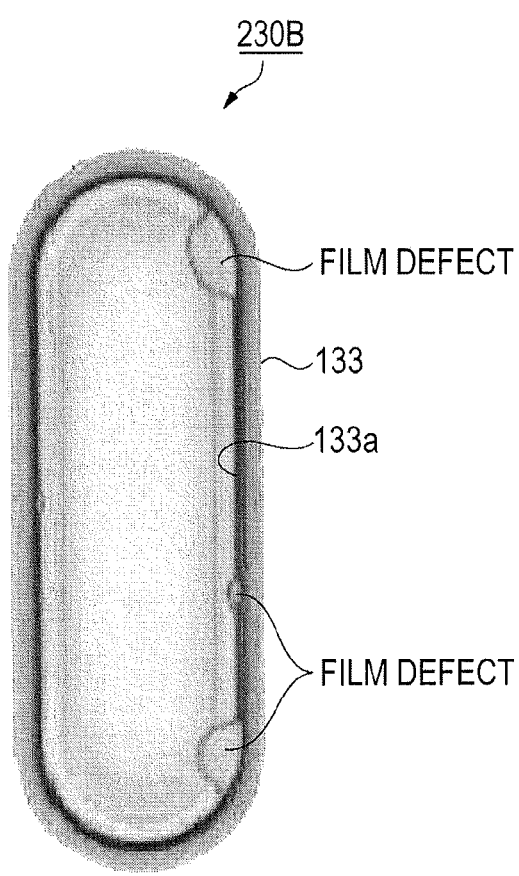
FIG. 11A is a photo showing a state of a film formation of a hole transport layer in Comparative Example 1 and FIG. 11B is a photo showing a state of a film formation of a hole transport layer in Example.

As shown by the evaluation results in FIG. 10, in the hole transport layer 232b of Comparative Example 1 formed by applying the functional liquid (ink) including only hole transport material which is the low molecular material, a film defect occurred when the film was formed, as shown in FIG. 11A. The film defect occurred at a plurality of locations at the boundary portion between the barrier wall 133 and a film forming region 133a in the film forming region 133a surrounded by the barrier wall 133. In addition, in the hole transport layer 232b of Comparative Example 2 formed by applying the functional liquid (ink) including only PVK which is the high molecular material, when the film was formed, the film defect did not occur, however, the luminescent efficiency became half of that of Comparative Example 1 and the element lifetime became ⅕ of that of Comparative Example 1. In addition, in comparative Example 3 in which α-NPD was set to 60 wt % and PVK was set to 40 wt % at the mixing ratio, and the weight average molecular weight of PVK was set to 500,000, the viscosity of the functional liquid (ink) increased, and thus it was difficult to discharge the functional liquid (ink) as a droplet and form the hole transport layer 232b to a degree capable of evaluating.

Figure 11B:
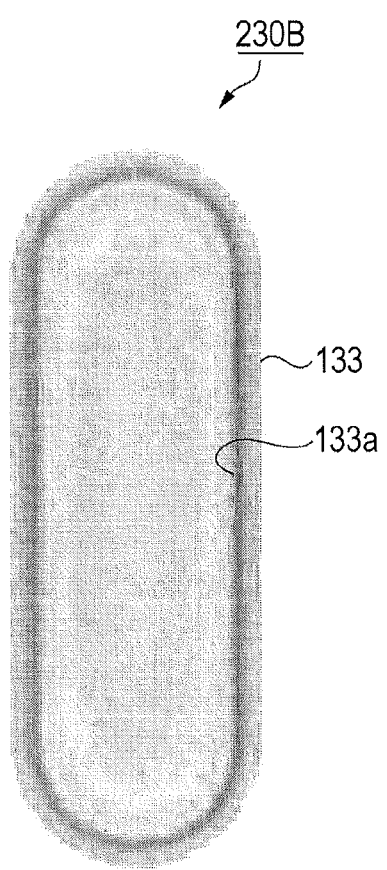

In contrast, in Example 1 to Example 10 in which α-NPD was set from 10 wt % to 90 wt % (in other words, PVK was set from 90 wt % to 10 wt %) at the mixing ratio and the weight average molecular weight of PVK was set from 10,000 to 300,000, it was possible to form the hole transport layer 232b without any film defect when the film was formed, as shown in FIG. 11B. In the evaluations of the luminescent efficiency (Cd/A) and the element lifetime (LT50), it was possible to realize more excellent level than that of Comparative Example 2. In particular, if the mixing ratio of α-NPD which is the low molecular material was set from 60 wt % to 90 wt %, it was possible to realize almost the same level as that of Comparative Example 1 in the luminescent efficiency and the element lifetime, while realizing a stable film formation of the hole transport layer 232b. Moreover, since it was difficult to properly perform the evaluations of the luminescent efficiency and the element lifetime in Comparative Example 1 if the film defect occurred in the film formation of the hole transport layer 232b as shown in FIG. 11A, the evaluation was carried out using the organic EL element 230B including the hole transport layer 232b formed by applying the functional liquid (ink) using in Comparative Example 1 by a spin coat method.

The thin film layer formed using the functional liquid (ink) including a material in which the low molecular material and the high molecular material are mixed is not limited to the hole transport layer among the functional layers. The thin film layer may be applied to at least one layer among three layers of the hole injection layer, the hole transport layer, and the luminescence layer. In particular, it is preferable to apply to the thin film layer formed thereafter rather than the thin film layer firstly formed in the film forming region subjected to the surface treatment such as an $O_2$ plasma treatment or a UV ozone treatment.

FIG. 12 is a table showing the low molecular materials and the high molecular materials capable of being applied to the hole injection layer, the hole transport layer, and the luminescence layer in the functional layer.

The hole injection layer can be applied to a configuration including the same kind of low molecular material and the same kind of high molecular material as those of the hole transport layer. Specifically, as shown in FIG. 12, m-MTDATA, 2T-NATA, 1T-NATA, NATA, NPNPB, TPD, and N,N'-bis(naphthalen-1-yl)-N,N'-bis(phenyl)-benzidine are included as a low molecular material. Poly(3-hexylthiophene-2,5-diyl), poly(thiophene-2,5-diyl), poly(N-vinylcarbazole), and poly[N,N'-bis(4-butylphenyl)-N,N'-bis(phenyl)-benzidine] are included as a high molecular material.

If the hole transport layer as an upper layer laminated on the hole injection layer as a lower layer is configured so as to include the same kind of high molecular material as the high molecular material included in the hole injection layer of the lower layer, it is possible to improve adhesion properties between the hole injection layer and the hole transport layer. In other words, when the hole transport layer as an upper layer is formed on the hole injection layer as a lower layer by the liquid phase process, it is possible to reduce the occurrence of unevenness of the film formation resulting from insufficient adhesion properties. "The same kind" described above indicates having the same material or the same skeleton. For example, in a case where the high molecular material included in the hole injection layer is set to polyaniline, it is preferable that the hole transport layer laminated on the hole injection layer include polyaniline or a derivative of polyaniline as a high molecular material.

As shown in FIG. 12, in the configuration of the luminescence layer of blue color, N,N'-bis(naphthalen-1-yl)-N,N'-bis(phenyl)-benzidine, 4,4'-bis(2,2-diphenyl-ethen-1-yl)biphenyl, 2-tert-butyl-9,10-di(naphth-2-yl)anthracene, 4,4'-bis[2,2-di(4-methylphenyl)-ethen-1-yl]biphenyl, 4,4'-bis[4-(di-p-tolylamino)styryl]biphenyl, and bis(3,5-difluoro-2-(2-pyridyl)phenyl-(2-carboxypyridyl)iridium(III) are included as a low molecular material. Poly(methylmethacrylate), poly(9,9-dioctylfluorenyl-2,7-diyl), and poly[(9,9-dioctylfluorenyl-2,7-diyl)-co-(9-hexyl-3,6-carbazole)] are included as a high molecular material.

In the same way, as shown in FIG. 12, in the configuration of the luminescence layer of green color, 4,4'-bis(carbazol-9-yl)biphenyl, 3-(2-benzothiazolyl)-7-(diethylamino)coumarin, N,N'-dimethyl-quinacridone, tris(2-phenylpyridine)iridium(III), 4,4'-bis(carbazol-9-yl)biphenyl, 4,4'-bis(carbazol-9-yl)-2,2'-dimethylbiphenyl, and tris(8-hydroxyquinolinato)aluminium are included as a low molecular material. Poly[(9,9-dioctylfluorenylene-2,7-diyl)-co-(1,4-phenylenevinylene)], poly[(9,9-dioctyl-2,7-divinylenefluorenylene)-alt-co-{2-methoxy-5-(2-ethylhexyloxy)-1,4-phenylene}], and poly[(9,9-dioctyl-2,7-bis{2-cyanovinylenefluorenylene})-alt-co-(2-methoxy-5-{2-ethylhexyloxy}-1,4-phenylene)] are included as a high molecular material.

In the same way, as shown in FIG. 12, in the configuration of the luminescence layer of red color, (E)-2-(2-(4-(dimethylamino)styryl)-6-methyl-4H-pyran-4-ylidene), malononitrile, 4-(dicyanomethylene)-2-methyl-6-julolidyl-9-enyl-4H-pyran, 4-(dicyanomethylene)-2-tert-butyl-6-(1,1,7,7-tetramethyljulolidin-4-yl-vinyl)-4H-pyran, bis(2-benzo[b]thiophen-2-yl-pyridine)(acetylacetonate)iridium(III), 4,4'-bis(carbazol-9-yl)biphenyl, 4,4'-bis(carbazol-9-yl)-2,2'-dimethylbiphenyl, and tris(8-hydroxy-quinolinato) aluminium are included as a low molecular material. Poly[{9,9-dihexyl-2,7-bis(1-cyanovinylene)fluorenylene}-alt-co-{2,5-bis(N,N'-diphenylamino)-1,4-phenylene}], poly[{2-methoxy-5-(2-ethylhexyloxy)-1,4-(1-cyanovinylenephenylene)}-co-{2,5-bis(N,N'-diphenylamino)-1,4-phenylene}], and poly[1-methoxy-4-(2-ethylhexyloxy-2,5-phenylenevinylene)] are included as a high molecular material.

In a case where the hole injection layer, the hole transport layer, and the luminescence layer are respectively formed by using the liquid phase process, a combination of the low molecular material described above and the high molecular material described above is desirable to be a combination in which higher luminescent efficiency or a target chromaticity are obtained. In this respect, when the size of the band gap of the low molecular material is set to Eg1 and the size of the band gap of the high molecular material is set to Eg2, it is preferable to select the high molecular material in which the relation Eg1≤Eg2 is satisfied.

The low molecular material described above and the high molecular material described above are organic semiconductor materials, the band gap is equivalent to a difference between an HOMO level and an LUMO level in an energy level of electrons. Therefore, this relates to the energy bringing about luminescence. When the high molecular material having smaller band gap Eg2 than the band gap Eg1 of the low molecular material is used, a part of the energy bringing about luminescence is absorbed in the high molecular material having smaller band gap or an exciplex is formed. As a result, the energy bringing about luminescence substantively becomes smaller and the luminescent wavelength becomes a longer wavelength than a target wavelength, and thus there is a risk in which the luminescent efficiency decreases or the target chromaticity can not be obtained.

Therefore, since a part of the energy bringing about luminescence becomes difficult to be absorbed in the high molecular material or the exciplex becomes difficult to be formed by selecting the high molecular material in which the relation Eg1≤Eg2 is satisfied, it is possible to provide or manufacture the organic EL element in which the higher luminescent efficiency or the target chromaticity can be obtained.

The exciplex is formed between an electron-accepting molecule and an electron-donating molecule, for example, the electron-accepting molecule is a low molecular luminescence material and the electron-accepting molecule includes the high molecular material included in the hole transport layer coming into contact with the luminescence layer. When the exciplex is formed, a part of the energy bringing about luminescence is consumed by the exciplex.

Specifically, in the organic EL element 230B of blue shown in Example described above, in a case where the hole transport layer was formed using a solution including the low molecular material and the high molecular material by the liquid phase process, the chromaticity was improved by selecting the high molecular material which was combined with the low molecular material in consideration of the band gap as described above.

In addition, for example, when the high molecular material used for the luminescence layer of blue shown in FIG. 12 is applied to the luminescence layer of green, the problem does not occur in terms of the luminescent efficiency or the chromaticity, however, when the high molecular material used for the luminescence layer of green was applied to the luminescence layer of blue, the phenomenon in which the luminescence color of blue was shifted to a green side (a long wavelength side) and the coloring deteriorated was confirmed. A method of selecting the high molecular material according to the band gap described above is supported by such a phenomenon.

Moreover, as a method of measuring the band gap (the difference between a HOMO level and a LUMO level) in the low molecular material and the high molecular material, for example, a combination of photoelectron spectroscopy (HOMO level measurement) and UV visible absorption spectrum measurement method (LUMO level measurement) is included.

Third Embodiment

Electronic Device

Figure 13A:
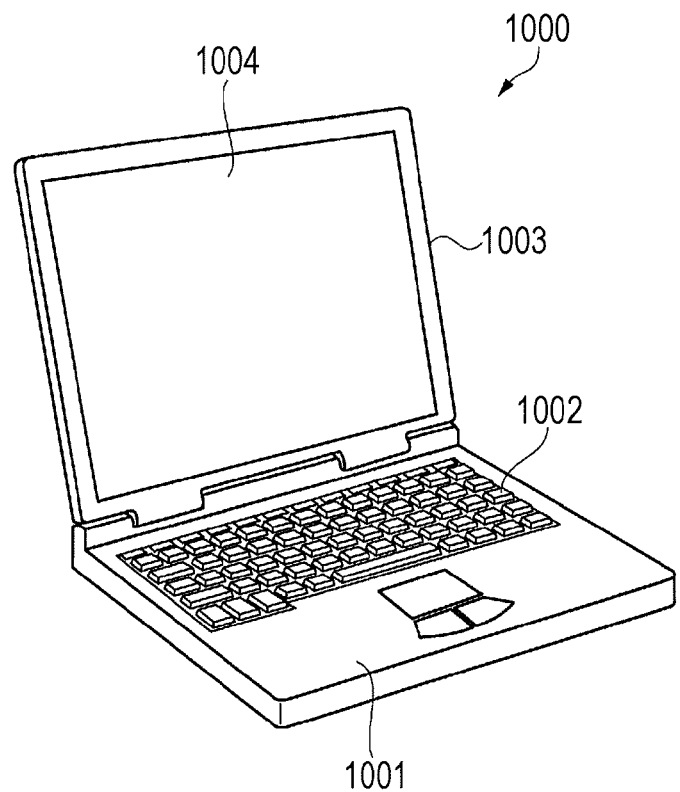
FIG. 13A is a schematic view showing a notebook type personal computer which is an example of an electronic device and FIG. 13B is a schematic view showing a thin type television (TV) which is an example of an electronic device.

Next, description will be given of an electronic device in the embodiment with reference to FIGS. 13A and 13B. FIG. 13A is a schematic view showing a notebook type personal computer which is an example of an electronic device and FIG. 13B is a schematic view showing a thin type television (TV) which is an example of an electronic device.

As shown in FIG. 13A, a personal computer 1000 as an electronic device is configured of a main body section 1001 provided with a key board 1002 and a display unit 1003 provided with a display section 1004, and the display unit 1003 is turnably supported through a hinge structure section with respect to the main body section 1001.

In this personal computer 1000, the organic EL apparatus 100 of the first embodiment or the organic EL apparatus 200 of the second embodiment is mounted on the display section 1004.

Figure 13B:
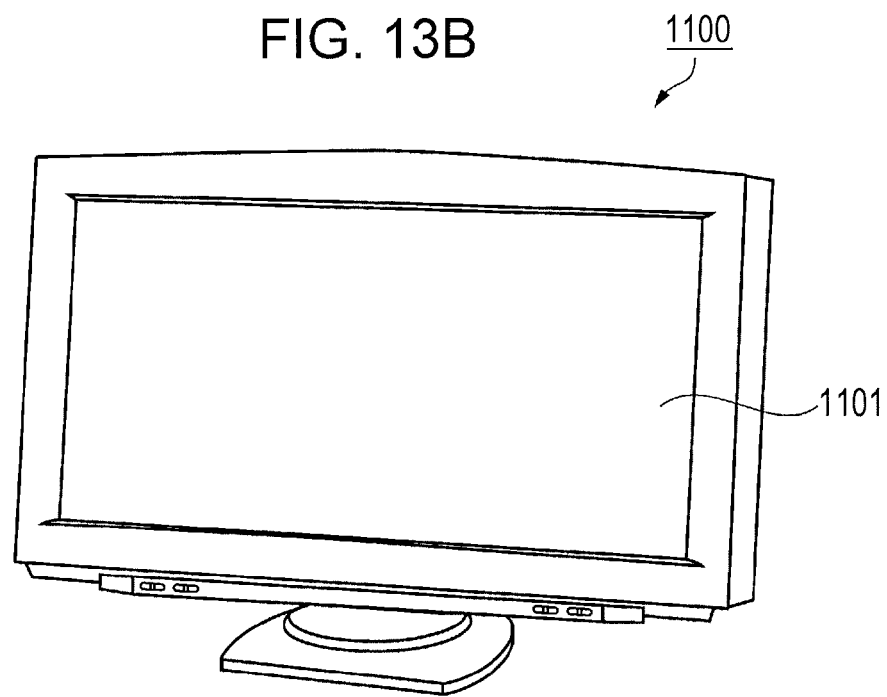

As shown in FIG. 13B, in a thin type television (TV) 1100 as an electronic device, the organic EL apparatus 100 of the first embodiment or the organic EL apparatus 200 of the second embodiment is mounted on the display section 1101.

As to the organic EL apparatuses 100 and 200, since the luminescent efficiency and the luminescent lifetime are improved and the organic EL apparatuses 100 and 200 are effectively manufactured by using the liquid phase process and the vapor phase process, the personal computer 1000 or the thin type TV 1100 excellent in cost performance can be provided.

Moreover, the electronic device on which the organic EL apparatus 100 or the organic EL apparatus 200 is mounted is not limited to the personal computer 1000 or the thin type TV 1100 described above. For example, the electronic device having a display section such as a portable type information terminal such as a smartphone or POS, a navigator, a viewer, a digital camera, or a monitor direct-view type video recorder is included. In addition, it is also possible to use the organic EL apparatus 100 or the organic EL apparatus 200 not only as the display section, but also as a lighting apparatus producing luminescence with a single color or multiple color or a photosensitive apparatus for sensitizing a photosensitive member.

The invention is not limited to the embodiment described above and can be appropriately changed in a range which is not contrary to the gist or the idea of the invention understood from the scope of claims and the entire specification, and a method of manufacturing an organic EL element in accordance with such changes and an organic EL apparatus or an electronic device to which the organic EL element is applied are also included in a technical scope of the invention. Various Modification Examples are considered in addition to the embodiment described above. Hereinafter, description will be given by giving Modification Example.

Modification Example 1

In the functional liquid (ink) 70 in Example described above, tetralin is used as a good solvent for dissolving the high molecular material, however, the configuration of the solvent in the functional liquid (ink) 70 is not limited thereto. The good solvent for dissolving the high molecular material is not limited to one kind, and two or more kind of solvents may be included. In addition, in order to ensure the discharge properties of the functional liquid (ink) 70, a poor solvent may be included as a solvent for adjusting the viscosity, in addition to the good solvent. Moreover, the boiling point (bp) of the poor solvent is preferably 200° C. or higher.

The entire disclosure of Japanese Patent Application No. 2013-181892, filed Sep. 3, 2013 is expressly incorporated by reference herein.

What is claimed is:

1. An organic EL element comprising:
an anode;
a cathode; and
a functional layer including at least a hole injection layer, a hole transport layer, and a luminescence layer laminated between the anode and the cathode from the anode side in order,
wherein at least one layer among the hole injection layer, the hole transport layer, and the luminescence layer includes a functional layer forming material,
wherein
the functional layer forming material includes
a low molecular material, and
a high molecular material,
a molecular weight of the low molecular material is 10,000 or less a weight average molecular weight of the high molecular material is from 10,000 to 300,000, and
a mixing ratio of the low molecular material is from 10 wt % to 90 wt % with respect to the weight of the functional layer forming material.

2. The organic EL element according to claim 1, wherein the high molecular material is selected from a polymethylmethacrylate resin, a silicone resin, an urethane resin, a norbornene resin, a fluororesin, a low-density polyethylene resin, a polyester resin, polyparaphenylene vinylene, polyfluorene, polyaniline, polythiophene, or polyvinylcarbazole and a derivative thereof.

3. The organic EL element according to claim 2, wherein when the size of a band gap of the low molecular material is set to Eg1 and the size of a band gap of the high molecular material is set to Eg2, the high molecular material in which the relation $Eg1 \leq Eg2$ is satisfied is selected.

4. The organic EL element according to claim 2,
wherein, in the functional layer, the high molecular material included in an upper layer laminated on a lower layer is the same type as the high molecular material included in the lower layer.

5. A method of manufacturing an organic EL element having a functional layer including at least a hole injection layer, a hole transport layer, and a luminescence layer laminated between an anode and a cathode from the anode side in order, comprising:
forming at least one layer among the hole injection layer, the hole transport layer, and the luminescence layer by applying a solution including a functional layer forming material,
wherein
the functional layer forming material includes
a low molecular material, and
a high molecular material,
a molecular weight of the low molecular material is 10,000 or less, a weight average molecular weight of the high molecular material is from 10,000 to 300,000, and
a mixing ratio of the low molecular material is from 10 wt % to 90 wt % with respect to a weight of the functional layer forming material.

6. The method of manufacturing an organic EL element according to claim 5,
wherein the high molecular material is selected from a polymethylmethacrylate resin, a silicone resin, an urethane resin, a norbornene resin, a fluororesin, a low-density polyethylene resin, a polyester resin, polyparaphenylene vinylene, polyfluorene, polyaniline, polythiophene, or polyvinylcarbazole and a derivative thereof.

7. The method of manufacturing an organic EL element according to claim 6,
wherein when the size of a band gap of the low molecular material is set to Eg1 and the size of a band gap of the high molecular material is set to Eg2, the high molecular material in which the relation Eg1≤Eg2 is satisfied is selected.

8. An organic EL apparatus comprising:
an organic EL element manufactured by using the method of manufacturing an organic EL element according to claim 7.

9. An organic EL apparatus comprising:
an organic EL element manufactured by using the method of manufacturing an organic EL element according to claim 7.

10. The method of manufacturing an organic EL element according to claim 6,
wherein, in the functional layer, the high molecular material included in the solution which is used to form an upper layer laminated on a lower layer is the same type as the high molecular material included in the lower layer.

11. An organic EL apparatus comprising:
an organic EL element manufactured by using the method of manufacturing an organic EL element according to claim 10.

12. An organic EL apparatus comprising:
an organic EL element manufactured by using the method of manufacturing an organic EL element according to claim 10.

13. An organic EL apparatus comprising:
an organic EL element manufactured by using the method of manufacturing an organic EL element according to claim 6.

14. An organic EL apparatus comprising:
an organic EL element manufactured by using the method of manufacturing an organic EL element according to claim 6.

15. The method of manufacturing an organic EL element according to claim 5,
wherein the solution includes a good solvent for dissolving the high molecular material, and
wherein the boiling point of the good solvent is 200° C. or higher.

16. An organic EL apparatus comprising:
an organic EL element manufactured by using the method of manufacturing an organic EL element according to claim 15.

17. An organic EL apparatus comprising:
an organic EL element manufactured by using the method of manufacturing an organic EL element according to claim 15.

18. An organic EL apparatus comprising:
an organic EL element manufactured by using the method of manufacturing an organic EL element according to claim 5.

19. An electronic device comprising:
the organic EL apparatus according to claim 18.

20. An organic EL apparatus comprising:
an organic EL element manufactured by using the method of manufacturing an organic EL element according to claim 5.

* * * * *